US009568557B2

(12) United States Patent
Kudo et al.

(10) Patent No.: US 9,568,557 B2
(45) Date of Patent: Feb. 14, 2017

(54) BATTERY MONITORING DEVICE AND BATTERY SYSTEM MONITORING DEVICE

(75) Inventors: Akihiko Kudo, Hitachinaka (JP); Mutsumi Kikuchi, Hitachinaka (JP); Tomonori Kanai, Hitachinaka (JP); Tatsumi Yamauchi, Hitachinaka (JP); Akihiro Machida, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 226 days.

(21) Appl. No.: 14/397,346

(22) PCT Filed: Apr. 27, 2012

(86) PCT No.: PCT/JP2012/061420
§ 371 (c)(1),
(2), (4) Date: Oct. 27, 2014

(87) PCT Pub. No.: WO2013/161068
PCT Pub. Date: Oct. 31, 2013

(65) Prior Publication Data
US 2015/0323609 A1    Nov. 12, 2015

(51) Int. Cl.
| H01M 10/46 | (2006.01) |
| G01R 31/36 | (2006.01) |
| G01R 1/28 | (2006.01) |
| B60L 11/18 | (2006.01) |
| B60L 3/00 | (2006.01) |
| B60L 3/12 | (2006.01) |

(52) U.S. Cl.
CPC ......... *G01R 31/3658* (2013.01); *B60L 3/0046* (2013.01); *B60L 3/12* (2013.01); *B60L 11/1855* (2013.01); *B60L 11/1859* (2013.01); *B60L 11/1866* (2013.01); *G01R 1/28* (2013.01); *G01R 31/362* (2013.01); *B60L 2240/545* (2013.01); *B60L 2240/547* (2013.01); *B60L 2240/549* (2013.01)

(58) Field of Classification Search
CPC .............................. H02J 7/0021; H02J 7/0047
USPC ......... 320/107, 132, 149, DIG. 21; 324/436, 324/433; 340/636.1, 636.12, 636.15; 702/63, 64
See application file for complete search history.

(56) References Cited

U.S. PATENT DOCUMENTS

| 7,012,558 B1 | 3/2006 | Arimura et al. |
| 7,039,534 B1 * | 5/2006 | Ryno ............... G01R 19/16542 320/134 |
| 2007/0202371 A1 * | 8/2007 | Takeda ............... G01R 31/3658 429/432 |

FOREIGN PATENT DOCUMENTS

| EP | 1701175 A2 | 9/2006 |
| EP | 2085784 A2 | 8/2009 |
| EP | 2224257 A2 | 9/2010 |
| JP | 2009-183025 A | 8/2009 |
| JP | 2012-047522 A | 3/2012 |

\* cited by examiner

*Primary Examiner* — Edward Tso
(74) *Attorney, Agent, or Firm* — Volpe and Koenig, P.C.

(57) ABSTRACT

A battery monitoring device for monitoring a cell group made by connecting a plurality of single battery cells in series includes a reference voltage generation circuit configured to generate a variable reference voltage, a switching circuit configured to select, as a measurement target voltage, any one of a plurality of types of voltages including the cell voltages of the single battery cells in the cell group and the reference voltage, and an AD converter configured to measure the measurement target voltage which is selected by the switching circuit, and output a digital signal according to the measurement result.

8 Claims, 18 Drawing Sheets

FIG. 3

| MEASUREMENT TARGET | CELL 12 | CELL 11 | CELL 10 | CELL 9 | CELL 8 | CELL 7 | CELL 6 | CELL 5 | CELL 4 | CELL 3 | CELL 2 | CELL 1 | REFERENCE VOLTAGE Vref1 |
|---|---|---|---|---|---|---|---|---|---|---|---|---|---|
| SWITCHING CIRCUIT 501 UPPER SIDE | A1 | A2 | A3 | A4 | A5 | A6 | A7 | A8 | A9 | A10 | A11 | A12 | A13 |
| SWITCHING CIRCUIT 501 LOWER SIDE | B1 | B2 | B3 | B4 | B5 | B6 | B7 | B8 | B9 | B10 | B11 | B12 | B12 |

FIG. 13

| MEASUREMENT TARGET | CELL 12 | CELL 11 | CELL 10 | CELL 9 | CELL 8 | CELL 7 | CELL 6 | CELL 5 | CELL 4 | CELL 3 | CELL 2 | CELL 1 | REFERENCE VOLTAGE Vref1 | REFERENCE VOLTAGE Vref2 | CELL 1 NEGATIVE TERMINAL |
|---|---|---|---|---|---|---|---|---|---|---|---|---|---|---|---|
| SWITCHING CIRCUIT 501 UPPER SIDE | A1 | A2 | A3 | A4 | A5 | A6 | A7 | A8 | A9 | A10 | A11 | A12 | A13 | A1 | A14 |
| SWITCHING CIRCUIT 501 LOWER SIDE | B1 | B2 | B3 | B4 | B5 | B6 | B7 | B8 | B9 | B10 | B11 | B12 | B12 | B13 | B12 |

FIG. 15

| MEASUREMENT TARGET | CELL 12 | CELL 11 | CELL 10 | CELL 9 | CELL 8 | CELL 7 | CELL 6 | CELL 5 | CELL 4 | CELL 3 | CELL 2 | CELL 1 | REFERENCE VOLTAGE Vref1 | CELL 1 NEGATIVE TERMINAL | CELL GROUP VOLTAGE |
|---|---|---|---|---|---|---|---|---|---|---|---|---|---|---|---|
| SWITCHING CIRCUIT 501 UPPER SIDE | A1 | A2 | A3 | A4 | A5 | A6 | A7 | A8 | A9 | A10 | A11 | A12 | A13 | A14 | NOT RELEVANT |
| SWITCHING CIRCUIT 501 LOWER SIDE | B1 | B2 | B3 | B4 | B5 | B6 | B7 | B8 | B9 | B10 | B11 | B12 | B12 | B12 | NOT RELEVANT |
| SWITCHING DEVICE 513 | D1 | D1 | D1 | D1 | D1 | D1 | D1 | D1 | D1 | D1 | D1 | D1 | D1 | D1 | D2 |

FIG. 17

| MEASUREMENT TARGET | CELL 12 | CELL 11 | CELL 10 | CELL 9 | CELL 8 | CELL 7 | CELL 6 | CELL 5 | CELL 4 | CELL 3 | CELL 2 | CELL 1 | REFERENCE VOLTAGE Vref1 | CELL 1 NEGATIVE TERMINAL | CELL 12 NEGATIVE TERMINAL |
|---|---|---|---|---|---|---|---|---|---|---|---|---|---|---|---|
| SWITCHING CIRCUIT 501 UPPER SIDE | A1 | A2 | A3 | A4 | A5 | A6 | A7 | A8 | A9 | A10 | A11 | A12 | A13 | A14 | A2 |
| SWITCHING CIRCUIT 501 LOWER SIDE | B1 | B2 | B3 | B4 | B5 | B6 | B7 | B8 | B9 | B10 | B11 | B12 | B12 | B12 | B1 |

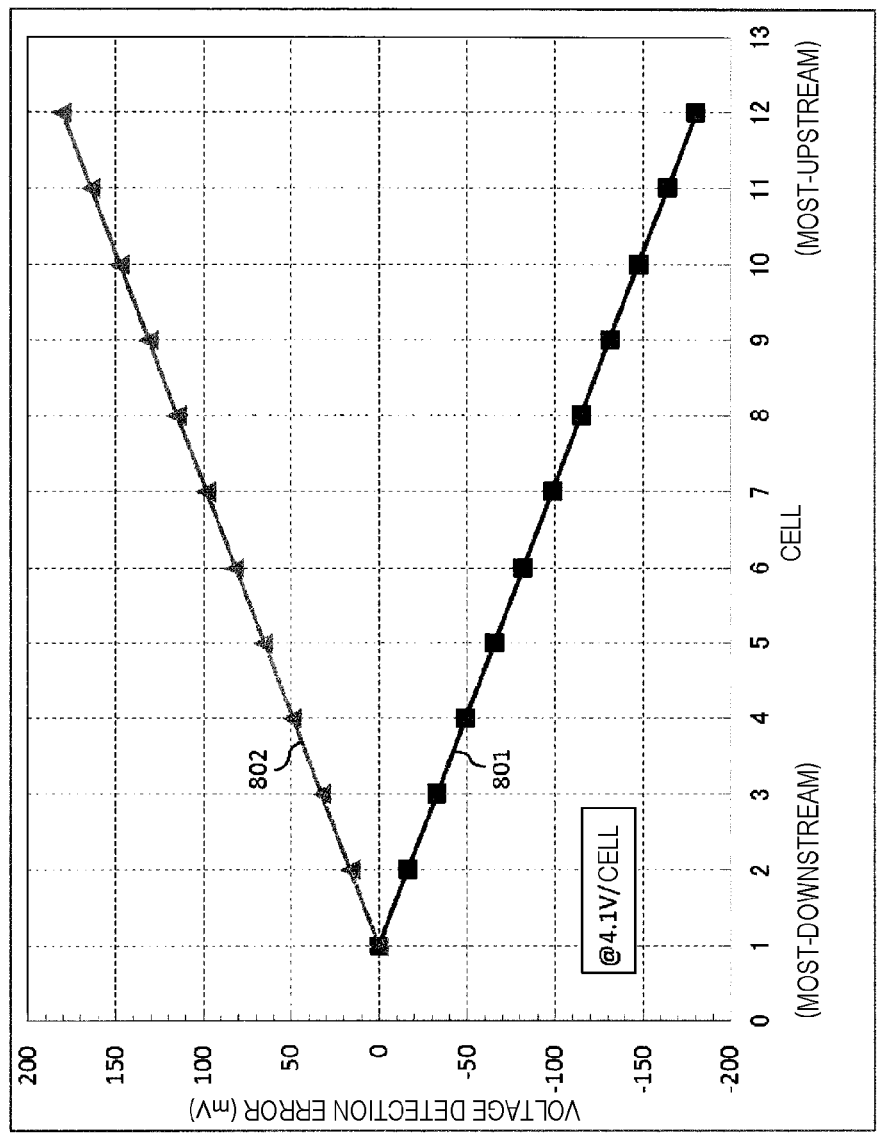

US 9,568,557 B2

BATTERY MONITORING DEVICE AND BATTERY SYSTEM MONITORING DEVICE

TECHNICAL FIELD

The present invention relates to a battery monitoring device and a battery system monitoring device having the same.

BACKGROUND ART

A hybrid electric vehicle (HEV), an electric vehicle (EV), and the like use a assembled battery (battery system) made by connecting, in series, multiple cell groups including multiple single battery cells of secondary batteries connected in series or connecting multiple cell groups in series and parallel in order to ensure a desired high voltage. In such an assembled battery, for calculating residual capacity, protecting and managing each single battery cell, a cell controller, which measures a cell voltage (a voltage between terminals of a single battery cell) and performs balancing discharge for balancing of the state of Charge (SOC) and more specifically for balancing the residual capacity, is provided in a monitoring device of the assembled battery to manage the assembled battery (see PTL 1). This cell controller includes multiple integrated circuits (cell controller ICs) to manage multiple cell groups explained above.

An integrated circuit disclosed in PTL 1 includes a voltage detection circuit constituted by a differential amplifier and an analog digital conversion device, and measures a cell voltage by using this voltage detection circuit. In addition, by causing the voltage detection circuit to measure the voltage of an already-known reference power source, a diagnosis can be done to find as to whether the differential amplifier and the analog digital conversion device are operating normally.

CITATION LIST

Patent Literature

PTL 1: JP 2009-183025 A

SUMMARY OF INVENTION

Technical Problem

A conventional diagnosis method using the voltage of the already-known reference power source disclosed in PTL 1 may not be able to detect abnormality when any one of the circuits is in a particular abnormality state in the measurement system for measuring a cell voltage. For example, it is difficult for the conventional method to correctly detect an abnormality state in which the error of the analog digital conversion device increases in a particular voltage range and an abnormality state in which the values of the resistors constituting the differential amplifier change and become unbalanced due to degradation over time which deteriorates the differential amplifier characteristics.

Solution to Problem

A battery monitoring device according to the present invention is for monitoring a cell group made by connecting a plurality of single battery cells in series, comprising: a reference voltage generation circuit configured to generate a variable reference voltage; a switching circuit configured to select, as a measurement target voltage, any one of a plurality of types of voltages including the cell voltages of the single battery cells in the cell group and the reference voltage; and an AD converter configured to measure the measurement target voltage which is selected by the switching circuit, and output a digital signal according to the measurement result.

Advantageous Effects of Invention

According to the invention, the abnormality state in the measurement system for measuring a cell voltage can be correctly detected.

BRIEF DESCRIPTION OF DRAWINGS

FIG. 3 is a list table illustrating connection in a switching circuit when a conventional cell controller IC selects cell voltages and a reference voltage.

FIG. 13 is a list table illustrating connection in a switching circuit when a cell controller IC according to the fifth embodiment of the present invention selects each cell voltage, a reference voltage, and a negative terminal voltage of a cell 1.

FIG. 15 is a list table illustrating connections in the switching circuit when the cell voltages, the reference voltage, and the negative terminal voltage of the cell 1 are selected, and connections in the switching device when a divided voltage according to a cell group voltage is selected in the cell controller IC according to the sixth embodiment of the present invention.

FIG. 17 is a list table illustrating connections in the switching circuit when the cell voltages, the reference voltage, the negative terminal voltage of the cell 1 and of the negative terminal voltage of cell 12 are selected in the cell controller IC according to the seventh embodiment of the present invention.

FIG. 18 is a figure illustrating an example of a characteristics chart showing a relationship between a voltage detection error and a cell position when the resistance value of the differential amplifier circuit changes, and the input terminals of the differential amplifier circuit are connected to the negative electrode-side of the same cell to be short-circuited.

DESCRIPTION OF EMBODIMENTS

Hereinafter, embodiments for carrying out the present invention will be explained with reference to drawings. The embodiments explained below is examples in which the present invention is applied to a battery system monitoring device used for a hybrid electric vehicle (HEV). It should be noted that the present invention is not limited to the HEV, and the present invention can be widely applied to various types of battery systems provided on a plug-in hybrid electric vehicle (PHEV), an electric vehicle (EV), a railroad vehicle, and the like.

In the embodiments explained below, an electric storage/discharge device serving as the minimum unit of control is considered to be a Li-ion battery of which voltage is in a range of 3.0 to 4.2 V (average output voltage: 3.6 V), but the electric storage/discharge device may be other than the above and may be any device capable of accumulating and discharging electricity and restricting usage when the SOC (State of Charge) is too high (overcharge) or too low (overdischarge). In this case, such device is collectively referred to as a single battery, a single battery cell, or simply a cell.

In the embodiments explained below, a set of multiple single battery cells (about several to some dozen single battery cells) connected in series will be referred to as a cell group, and a set of multiple cell groups connected in series will be referred to as a battery module. Further, a set of multiple cell groups or multiple battery modules connected in series or in series and parallel will be referred to as an assembled battery. A cell controller IC serving as a battery monitoring device detecting the cell voltage of each single battery cell and monitoring the battery state while performing balancing operation and the like is provided for each cell group.

(Configuration of Electric Motor Driving Device)

Figure 1:
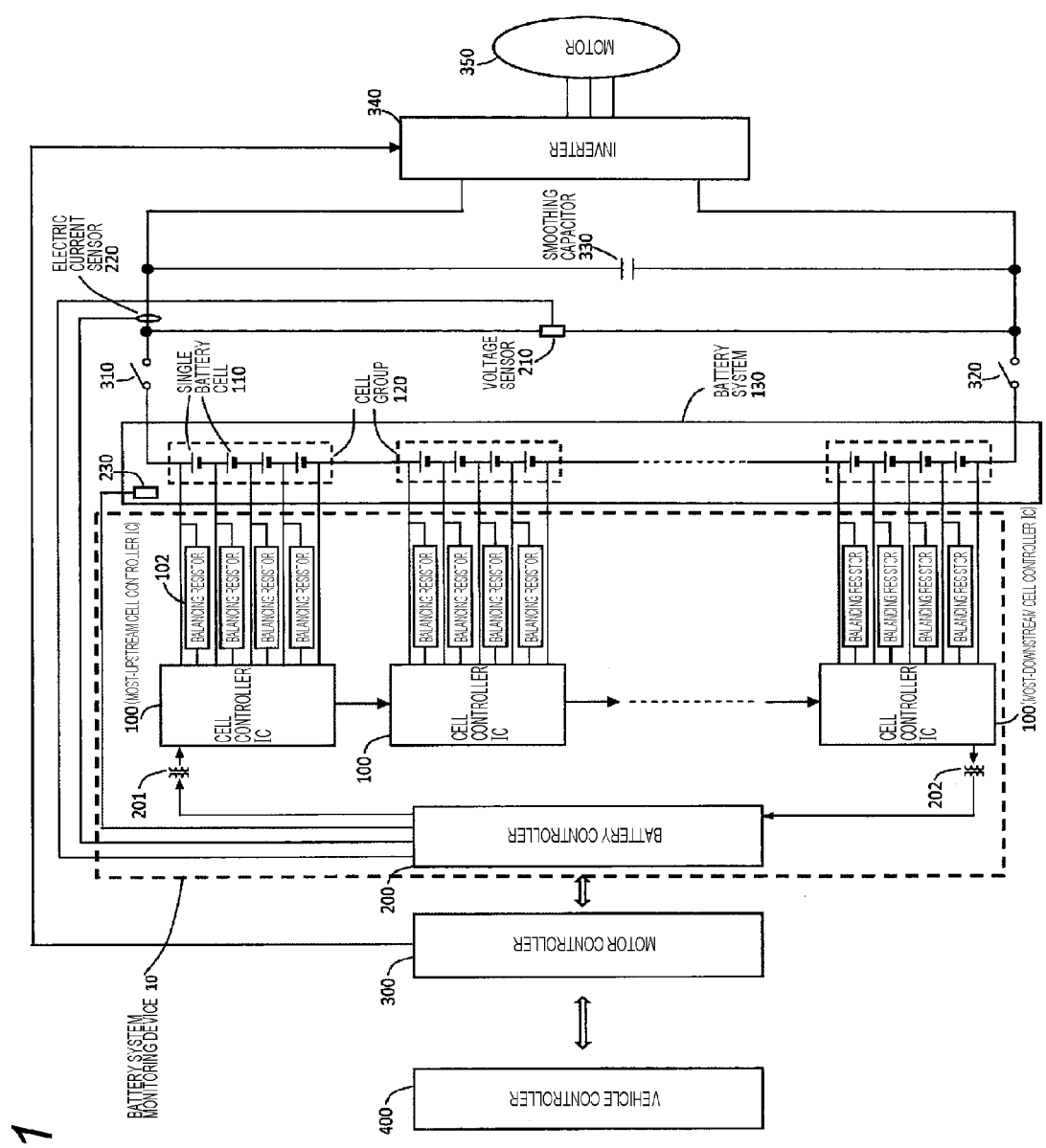
FIG. 1 is a view illustrating an example of a configuration of an electric motor driving device for a hybrid electric vehicle equipped with an electric storage device having a battery system monitoring device.

FIG. 1 is a view illustrating an example of a configuration of an electric motor driving device for a hybrid electric vehicle equipped with an electric storage device having a battery system monitoring device according to the present invention. This electric motor driving device includes a vehicle controller 400, a motor controller 300, a battery controller 200, multiple cell controller ICs 100, a battery system 130, an inverter 340, a motor 350, and the like. Among them, the vehicle controller 400, the motor controller 300, the battery controller 200, and the cell controller IC 100 and the inverter 340 exchange information with each other via a communication circuit provided in the vehicle.

The battery system 130 has multiple cell groups 120 connected in series. Further, each cell group 120 is configured by connecting multiple single battery cells 110 of secondary batteries such as Li-ion batteries connected in series.

The battery system monitoring device 10 includes a battery controller 200, multiple cell controller ICs 100, and connection circuits provided between each cell controller IC 100 and the cell group 120 and including a resistor, a capacitor, and the like. The electric storage device includes the battery system monitoring device 10 and the battery system 130.

A communication circuit between the battery controller 200 and the multiple cell controller ICs 100 is connected in a loop form. When a signal is transmitted from the battery controller 200 to the most-upstream cell controller IC 100 via a signal isolator 201, the signal is transmitted in series in order from the most-upstream cell controller IC 100 to the most-downstream cell controller IC 100. Finally, the signal is transmitted from the most-downstream cell controller IC 100 to the battery controller 200 via a signal isolator 202. The battery controller 200 can exchange information with all the cell controller ICs 100 via the communication circuit in the loop form.

In this case, for example, signal transmission is done between the battery controller 200 and each cell controller IC 100 via the communication circuit in the loop form. Alternatively, the signal transmission can be done using a bidirectional communication circuit. In this case, the signal isolator 202 is unnecessary. Still alternatively, although not shown, a communication circuit may be connected in parallel from the battery controller 200 to all the cell controller ICs 100, so that the signal transmission can be done in parallel.

The vehicle controller 400 controls the cruising speed and the traction/braking force of the vehicle on the basis of an operation signal given by vehicle driving operation devices such as a an accelerator pedal, a brake pedal, or a gear lever which are operated by the driver of the hybrid vehicle. The motor controller 300 controls the battery controller 200 and the inverter 340 on the basis of a speed command and a traction/braking force command given by the vehicle controller 400, and controls the rotation speed and the torque of the vehicle cruising driving motor 350.

The battery controller 200 controls charging/discharging and the SOC (State of Charge) of the battery system 130 on the basis of the voltage, the electric current, and the temperature of the battery system 130 detected by the voltage sensor 210, the electric current sensor 220, and the temperature sensor 230, respectively. In addition the battery controller 200 controls each cell controller IC 100 to manage the SOCs of the multiple single battery cells (hereinafter simply referred to as cells) 110 constituting the battery system 130, and performs discharging so as to correct variation in the SOC (hereinafter referred to as balancing discharge) so as to avoid overcharged state.

In the embodiment as shown in FIG. 1, for example, the battery system 130 is configured such that multiple cell groups 120 having four cells 110 connected in series are connected in series. However, the number of single battery cells 110 constituting the cell group 120 is not limited thereto. Alternatively, the number of single battery cells 110 may be equal to or more than four or may be less than four. A cell controller IC 100 suitable for the specification of the cell group 120 may be used. The battery system 130 provided on the hybrid vehicle is generally a high-voltage and high-capacity battery system in which many cells or cell groups are connected in series and parallel, and the voltage between the terminals is several hundred voltage. It is to be understood that the present invention can also be applied to such high-voltage and high-capacity battery system.

The cell controller IC 100 is provided for each cell group 120 made by dividing the multiple cells 110 into a predetermined number of cells 110 constituting the battery system 130. For example, suppose that a battery system 130 having one hundred cells 110 connected in series is divided into groups each having four cells 110, and twenty five cell groups 120 are provided in the battery system 130. In this case, twenty five cell controller ICs 100 are used, which is the same number of cell groups 120.

Each cell controller IC 100 detects the voltage between terminals of each cell 110 (cell voltage) constituting each cell group 120, and transmits the detection result to the battery controller 200. Then, energizing control of the balancing electric current is performed for each cell 110 in order to correct variation of the SOC of each cell 110 in accordance with the command given by the battery controller 200. As described above, the cell controller IC 100 monitors the cell group 120. It should be noted that the balancing resistor 102 is a resistor for restricting the electric current of the discharging of each cell 110 (balancing discharge), and is provided for each cell 110.

A direct current electric power charged in the battery system 130 is provided to a smoothing capacitor 330 and an inverter 340 via a positive electrode-side contactor 310 and a negative electrode-side contactor 320. The direct current electric power provided from the battery system 130 is converted by the inverter 340 into an alternate current electric power to be applied to an alternate current motor 350, so that the alternate current motor 350 is driven. The conversion from the direct current electric power into the alternate current electric power is done by switching of a switching device (not shown) provided in the inverter 340. On the other hand, when the vehicle brakes, the alternate current electric power generated by the alternate current motor 350 is converted into a direct current electric power by a diode device (not shown) and the smoothing capacitor 330 provided in the inverter 340. This direct current electric power is applied to the battery system 130 via the positive electrode-side contactor 310 and the negative electrode-side contactor 320, so that the battery system 130 is charged. More specifically, the direct current electric power is exchanged between the battery system 130 and the inverter 340.

Ripple noise and switching noise are generated by the operation of the inverter 340. These noises are somewhat reduced by the smoothing capacitor 330, but cannot be completely eliminated, and the noises flow into the battery system 130. Therefore, noise voltage in proportional to the noise electric current is superimposed on the cell voltage of each cell 110. This noise voltage causes detection error of the cell voltage, and therefore, this is suppressed by using an RC filter and the like in the voltage measurement circuit (not shown) provided in the cell controller IC 100.

Subsequently, the details of the cell controller IC 100 will be explained. As explained in details later, the cell controller IC 100 provided in the battery system monitoring device 10 includes a successive conversion-type AD converter and a differential amplifier circuit. Therefore, this may cause an abnormality state in which the error of the analog digital conversion device increases in a particular voltage range and an abnormality state in which the values of the resistors constituting the differential amplifier circuit change and become unbalanced due to degradation over time which deteriorates the differential amplifier characteristics. In the present invention, various improvements have been made on the cell voltage measurement system of the cell controller IC 100 in order to correctly detect these abnormality states.

(Conventional Cell Controller IC)

Figure 2:
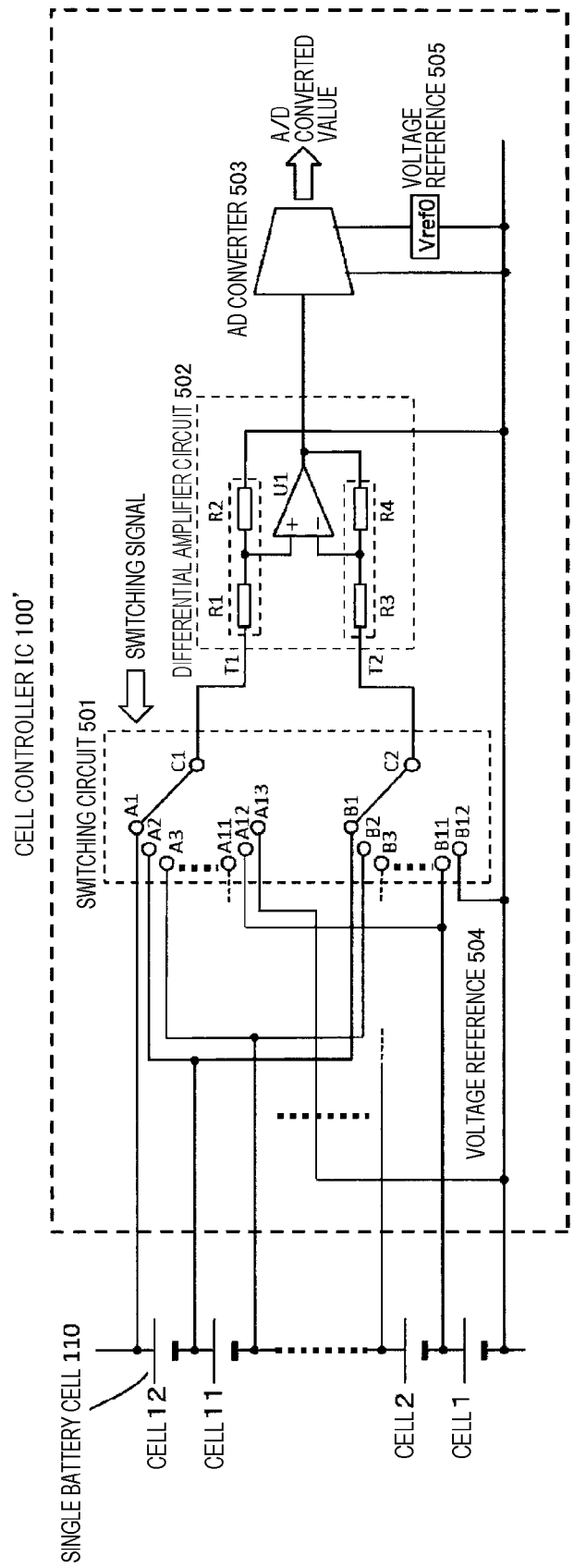
FIG. 2 is a view illustrating an example of a configuration of a cell voltage measurement system of a conventional cell controller IC.

In this case, before the cell controller IC 100 according to the present invention is explained, the conventional cell controller IC will be explained. FIG. 2 is a view illustrating an example of a configuration of a cell voltage measurement system of the conventional cell controller IC 100'. In this example, a single cell group 120 is constituted by twelve cells 110 connected in series. In the explanation below, these twelve cells 110 will be referred to as a cell 1 to a cell 12 arranged from a low potential side to a high potential side. In FIG. 2, the cells 3 to 10 are not shown. The positive/negative electrode terminals of the cells 1 to 12 are connected to the cell controller IC 100' via totally thirteen voltage detection lines.

In the cell controller IC 100', the voltage detection lines from the positive/negative electrode terminals of the cells 1 to 12 are connected to the input-side of the switching circuit 501. The input-side of the switching circuit 501 is also connected to a voltage reference 504 generating a reference voltage Vref1 using the negative terminal voltage of the cell 1 as the ground voltage. The switching circuit 501 selectively switches a combination of any two of them in accordance with a switching signal which is output from a logic unit, not shown, and outputs the combination to input terminals T1, T2 of the differential amplifier circuit 502. With such operation of the switching circuit 501, any one of the cell voltages of the cells 1 to 12 and the reference voltage Vref1 generated by the voltage reference 504 is selected as a measurement target voltage.

FIG. 3 is a list table illustrating connection in the switching circuit 501 when selecting the cell voltages of the cells 1 to 12 and the reference voltage Vref1 given by the voltage reference 504. As shown in the table, the connections of the upper side and the lower side of the switching circuit 501 are switched respectively, the cell voltages of the cells 1 to 12 and the reference voltage Vref1 can be selectively applied to between the input terminal T1 and the input terminal T2 of the differential amplifier circuit 502. For example, when the cell voltage of the cell 12 is selected, the switching circuit 501 selects the terminal A1 and the terminal B1 at the input side and connects them to the terminals C1, C2 at the output side. Therefore, the cell voltage between the positive electrode terminal and the negative electrode terminal of the cell 12 is output to between the input terminal T1 and the input terminal T2 of the differential amplifier circuit 502. Likewise, the switching circuit 501 successively selects the terminals A1 to A12 and the terminals B1 to B12 at the input side and connects them to the terminals C1, C2, respectively, at the output side, so that the cell voltages of the cells 12 to 1 are selected and output to the differential amplifier circuit 502. When the terminal A13 and the terminal B12 at the input side are selected and connected to the terminals C1, C2, respectively, at the output side, the reference voltage Vref1 from the voltage reference 504 is output to the differential amplifier circuit 502. In FIG. 2, the terminals A4 to A10 and the terminals B4 to B10 are not shown.

The differential amplifier circuit 502 includes resistors R1, R2 provided at the side of the input terminal T1, resistors R3, R4 provided at the side of the input terminal T2, and a differential amplifier U1 having a + input terminal and a − input terminal. The + input terminal of the differential amplifier U1 is connected between the resistor R1 and the resistor R2, and the − input terminal is connected between the resistor R3 and the resistor R4. The measurement target voltage, which is selected by the switching circuit 501 and is input to the input terminals T1, T2 of the differential amplifier circuit 502, is differentially amplified by the differential amplifier U1 of the differential amplifier circuit 502, so that it is converted into a voltage in a predetermined range using the negative terminal voltage of the cell 1 as the reference. The converted measurement target voltage is output from the differential amplifier circuit 502 to the input side of the AD converter 503.

The AD converter 503 operates using the reference voltage Vref0 generated by the voltage reference 505, and converts the input analog signal into a digital signal, thus outputting an AD converted value. With this operation, the AD converter 503 measures the measurement target voltage converted by the differential amplifier circuit 502, and outputs the digital signal according to the measurement result. This digital signal is sent to a logic unit, not shown, and is converted into measurement information in a predetermined data format by communication control performed by the logic unit, and the measurement information is sent to the battery controller 200 of FIG. 1.

The battery controller 200 receives the measurement information from the cell controller IC 100', so that the battery controller 200 can obtain the measurement result of the cell voltages of the cells 1 to 12 and the reference voltage Vref1 given by the voltage reference 504. When the measurement result of the reference voltage Vref1 thus obtained is determined to be within a predetermined range, the battery controller 200 can confirm that the cell voltage measurement system of the cell controller IC 100' is operating normally. More specifically, the battery controller 200 can determine that all of the differential amplifier circuit 502, the AD converter 503, and the voltage reference 505 are normal.

Figure 4:
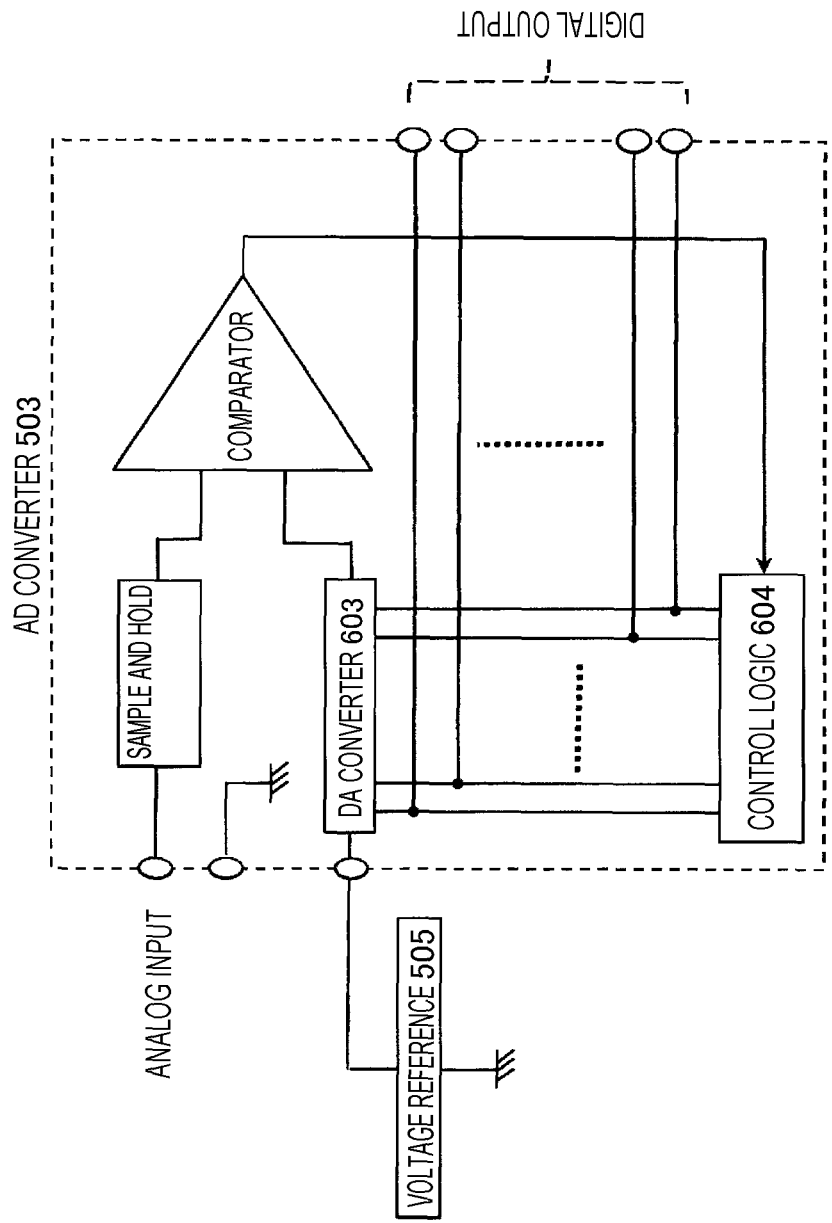
FIG. 4 is an explanatory diagram illustrating an internal configuration of an AD converter.

FIG. 4 is an explanatory diagram illustrating an internal configuration of an AD converter 503. In this case, a configuration is shown in a case where a successive conversion-type AD converter capable of performing measurement with a high degree of accuracy at a relatively high speed is used.

In FIG. 4, the sample and hold circuit 601 samples the measurement voltage, which is input by the AD converter 503, by holding it at a certain level during AD conversion. The sample-and-hold output voltage given by the sample and hold circuit 601 as well as the output voltage of the DA converter 603 are applied to the input side of the comparator 602. The comparator 602 compares the sample-and-hold output voltage and the output voltage of the DA converter 603, and outputs information indicating which of the voltage values is larger to the control logic 604. The control logic 604 outputs a digital signal of a predetermined number of bits on the basis of the output from the comparator 602. The DA converter 603 outputs the voltage according to the digital signal which is output from the control logic 604 on the basis of the reference voltage Vref0 given by the voltage reference 505. With such operation, the measurement voltage sampled and held by the sample and hold circuit 601 and the output voltage given by the DA converter 603 are repeatedly compared by the comparator 602, the digital signal according to the comparison result is determined by the control logic 604. This digital signal is output from the AD converter 503, so that the AD converter 503 converts the measurement voltage into the digital signal. The AD converter 503 performs such successive conversion operation, and outputs the measurement voltage as a logic value.

Figure 5:
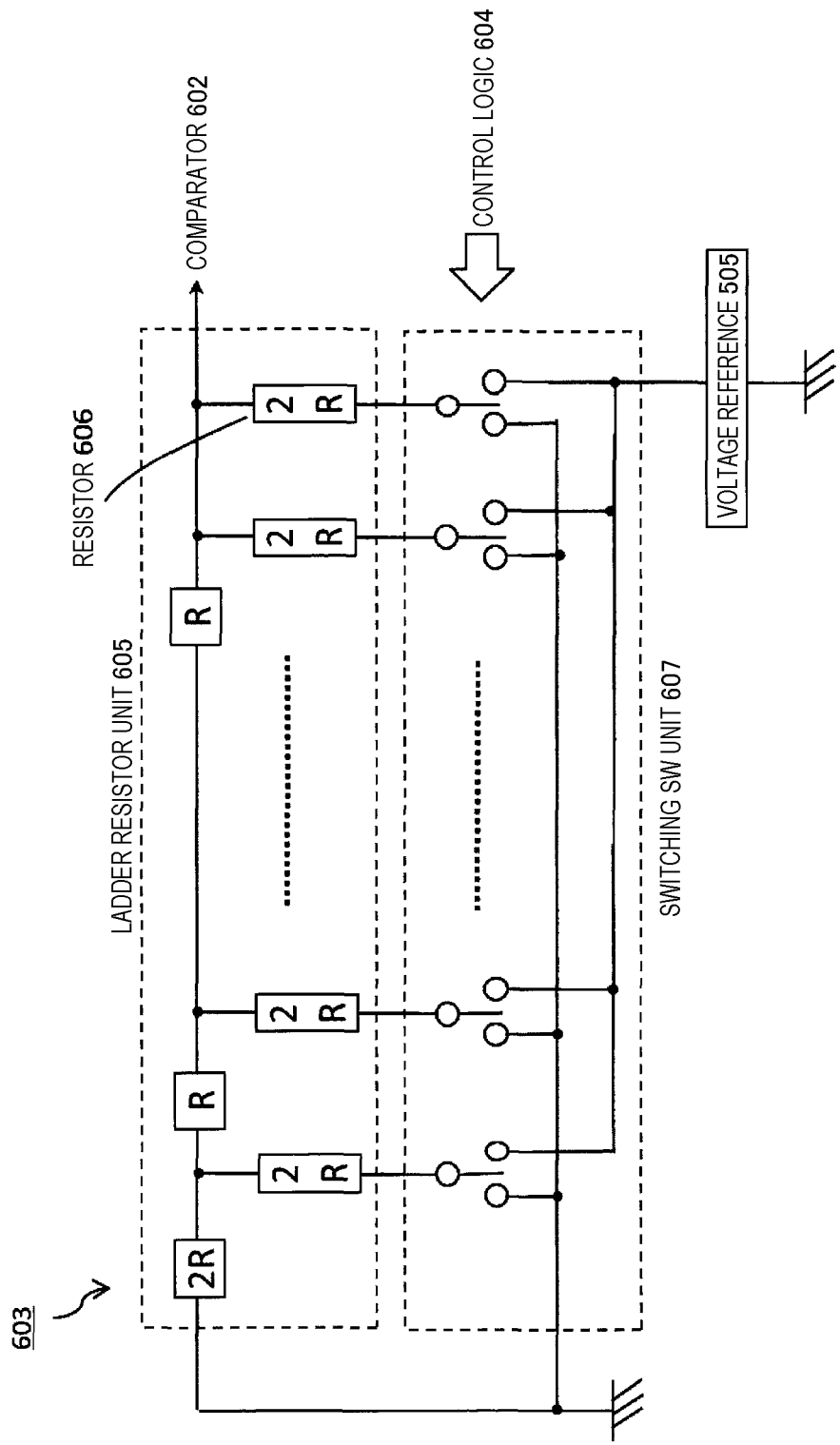
FIG. 5 is an explanatory diagram illustrating a configuration of a DA converter provided in a successive conversion-type AD converter.

FIG. 5 is an explanatory diagram illustrating a configuration of the DA converter 603 provided in the successive conversion-type AD converter 503 shown in FIG. 4. As shown in FIG. 5, the DA converter 603 includes a ladder resistor unit 605 in which multiple ladder resistors 606 are connected, and a switching SW unit 607 for switching connection of each ladder resistor 606 of the ladder resistor unit 605 in accordance with the control of the control logic 604 of FIG. 4. The switching SW unit 607 is connected to the voltage reference 505. In accordance with the value of each bit of the digital signal from the control logic 604, each switch of the switching SW 607 is controlled, whereby the connection between each ladder resistor 606 and the voltage reference 505 is turned ON or OFF. Therefore, the voltage according to the digital signal from the control logic 604 is output from the DA converter 603 to the comparator 602 as an analog output.

(Problems Associated with a Case where there is a Malfunction in the Successive Conversion-Type AD Converter in the Conventional Cell Controller IC)

Figure 6:
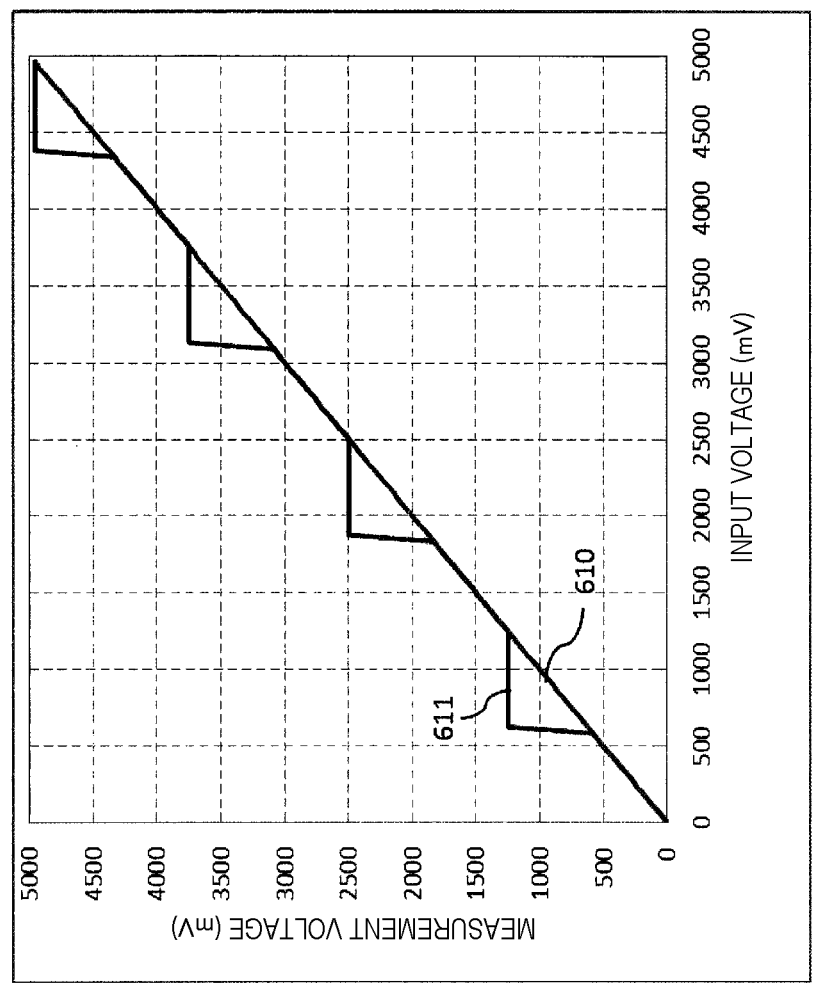
FIG. 6 is a figure illustrating an example of cell voltage detection characteristics when a malfunction occurs in a successive conversion-type AD converter of a conventional cell controller IC.

Subsequently, problems associated with a case where there is a malfunction in the successive conversion-type AD converter 503 in the conventional cell controller IC 100' explained above will be explained. FIG. 6 is a figure illustrating an example of cell voltage detection characteristics in a case where there is a malfunction in the successive conversion-type AD converter 503 in the conventional cell controller IC 100'. This case shows an example of voltage detection characteristics in a case where there is a malfunction that one of the switches of the switching SW unit 607 is fixed to the side of the voltage reference 505 in the configuration of the DA converter 603 in the AD converter 503 as shown in FIG. 5.

In FIG. 6, as compared with normal voltage detection characteristics 610 indicated by reference symbol 610, malfunctioning voltage detection characteristics indicated by reference symbol 611 are such that the voltage detection error is larger in each of the voltage ranges in which the input voltage is about 600 to 1200 mV, about 1800 to 2500 mV, about 3100 to 3700 mV, about 4300 to 5000 mV. This is because, in a voltage range in which the switch fixed to the side of the voltage reference 505 due to malfunction should be originally expected to be in the OFF state, the output voltage from the DA converter 603 is not output according to the control of the control logic 604, and therefore, the successive conversion operation of the AD converter 503 is not performed normally. This voltage range is different according to the position of the switch fixed in the switching SW unit 607. More specifically, when the switch corresponding to the LSB-side of the digital signal from the control logic 604 is fixed, the problem is no more than a reduction in the resolution, but if the switch corresponding to the MSB side is fixed, a larger error may occur.

In this case, as shown in FIG. 2, the conventional cell controller IC 100' includes a voltage reference 504 for diagnosing the malfunction of the cell voltage measurement system including the AD converter 503. However, in a case where the error peculiar to the successive conversion-type AD converter 503 explained above occurs, and more specifically, there is a malfunction in which the error increases only in a particular voltage range, the malfunction of the AD converter 503 cannot be correctly detected unless the reference voltage Vref1 given by the voltage reference 504 is within this voltage range. When there is a malfunction in the successive conversion-type AD converter 503, such problem may occur with the conventional cell controller IC 100'.

(Problems Associated with a Case where there is a Malfunction in Differential Amplifier Circuit in Conventional Cell Controller IC)

Figure 7:
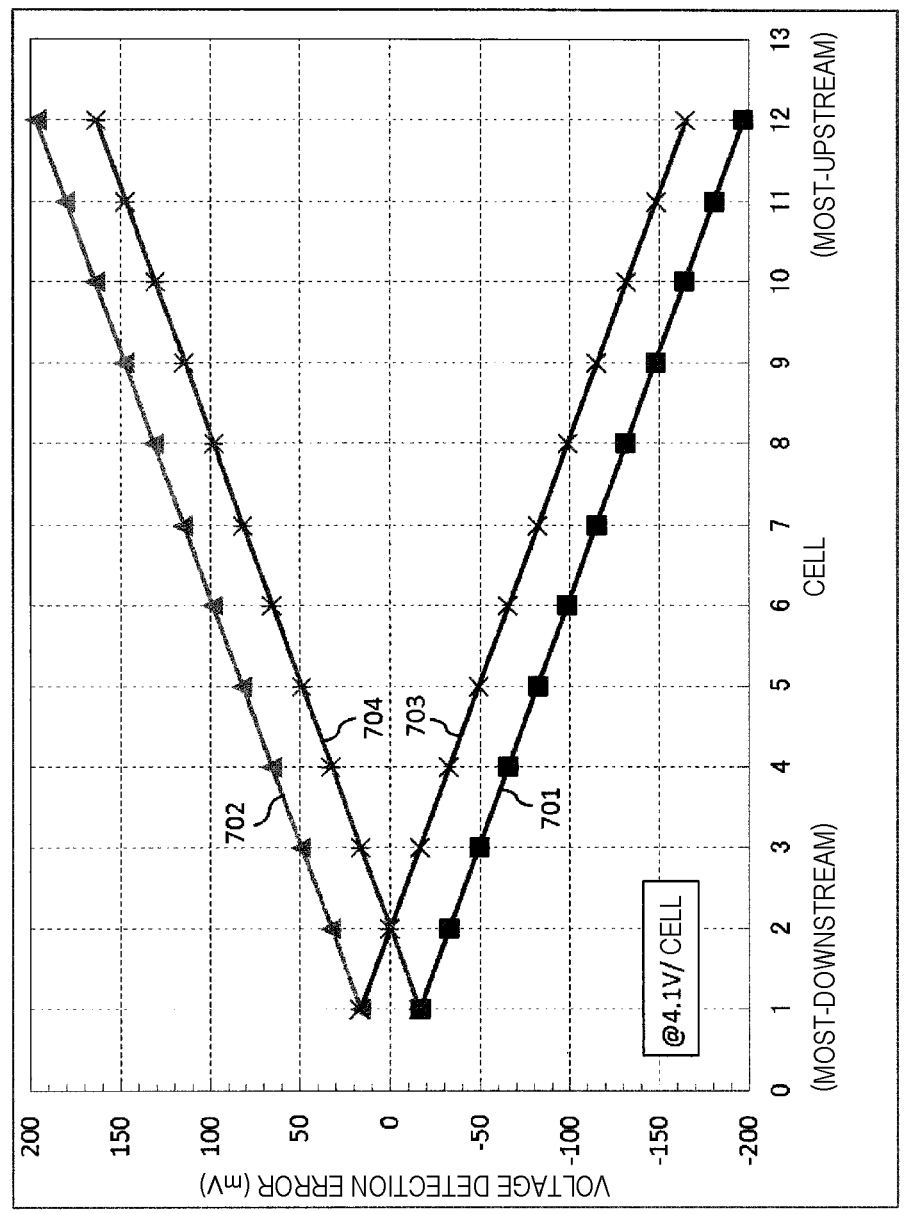
FIG. 7 is a figure illustrating an example of a characteristics chart representing a relationship between a cell position and a voltage detection error that occurs when there is a change in a resistance value in a differential amplifier circuit.

Subsequently, problems associated with a case where there is a malfunction in the differential amplifier circuit 502 in the conventional cell controller IC 100' will be explained. FIG. 7 is a figure illustrating an example of a characteristics chart representing a relationship between a cell position and a voltage detection error that occurs when there is a change in the resistance values of the resistors R1 to R4 of the differential amplifier circuit 502. In this case, FIG. 7 shows the relationship between the voltage detection error and the cell position in a case where the voltage dividing ratio at the + input terminal of the differential amplifier U1 and the voltage dividing ratio at the − input terminal of the differential amplifier U1 each change from 50% by ±0.2% when the cell voltage of each cell is 4.1 V in the configuration of the differential amplifier circuit 502 shown in FIG. 2 using each of the characteristics charts indicated by reference symbols 701 to 704. More specifically, the characteristics charts 701, 702 indicate the relationship between the voltage detection error and the cell position when the voltage dividing ratio at the + input terminal of the differential amplifier U1 is 49.8% and 50.2%, respectively. On the other hand, the characteristics charts 703, 704 indicate the relationship between the voltage detection error and the cell position when the voltage dividing ratio at the − input terminal of the differential amplifier U1 is 49.8% and 50.2%, respectively.

In FIG. 7, in any one of the characteristics charts 701 to 704, it is understood that a cell connected upstream and having a higher potential has a larger voltage detection error. In this example, in the most-downstream cell 1, the voltage detection error is about ±20 mV, but in the most-upstream cell 12, the voltage detection error increases to about ±200 mV. FIG. 7 shows an example of voltage detection error in a case where the number of cells is twelve, but as the number of cells connected in series increases, the voltage detection error becomes higher in the most-upstream cell.

In this case, the conventional cell controller IC 100' measures the reference voltage Vref1 given by the voltage reference 504 independent and different from the voltage reference 505 of the AD converter 503 explained above, thus detecting abnormality in the cell voltage measurement system. However, the reference voltage Vref1 given by the voltage reference 504 is a voltage where the ground voltage of the cell controller IC 100' is adopted as the reference. More specifically, the negative terminal voltage of the cell 1 is adopted as the reference. Therefore, even if the reference voltage Vref1 from the voltage reference 505 is measured when there is a change in the resistance values of the resistors R1 to R4 of the differential amplifier circuit 502, only the voltage detection error corresponding to the most-downstream cell 1 in each of the characteristics charts 701 to 704 of FIG. 7 can be measured. More specifically, with the malfunction diagnosis method performed by the conventional cell controller IC 100', the sensitivity for the change in the resistance value of the differential amplifier circuit 502 is low, and it is difficult to correctly detect the error explained above as a malfunction. In the conventional cell controller IC 100', such problem may occur when there is a malfunction in the differential amplifier circuit 502.

When there is a malfunction in the AD converter 503 and the differential amplifier circuit 502 explained above, the cell voltage cannot be correctly measured, and therefore, each cell may be overcharged or overdischarged. In particular, with a Li-ion battery, there is a risk of explosion, smoke, and combustion of a cell when the cell is overcharged, and therefore, it is absolutely necessary to avoid such situation. Even if the cell is not overcharged or overdischarged, a cell is charged and discharged in an expected voltage range, and this may degrade the characteristics of the battery system 130 in a shorter time.

Therefore, in the cell controller IC 100 according to the present invention, various types of improvements have been made in the cell voltage measurement system in order to correctly detect malfunction in the AD converter 503 and the differential amplifier circuit 502 explained above. Each of the contents of the improvements will be explained in each of the first to the seventh embodiments below.

First Embodiment

Figure 8:
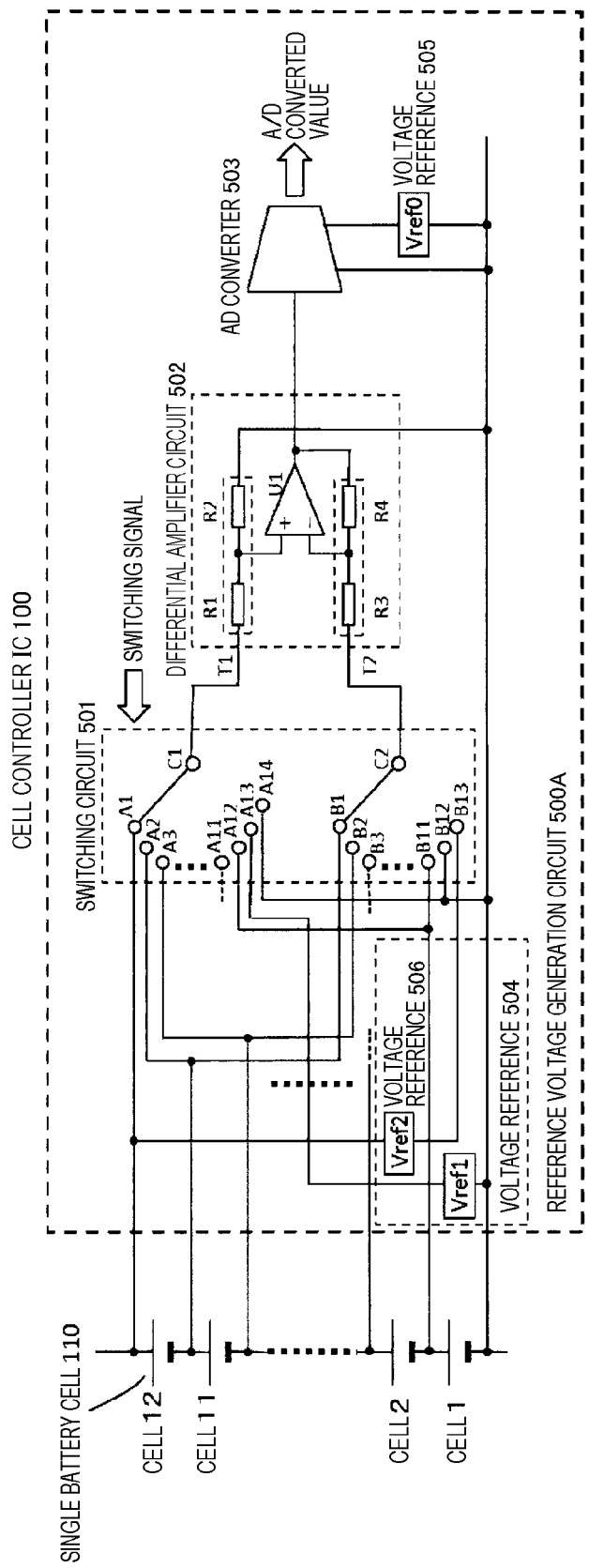
FIG. 8 is a view illustrating an example of a configuration of a cell voltage measurement system of a cell controller IC according to a first embodiment of the present invention.

FIG. 8 is a view illustrating an example of a configuration of a cell controller IC 100 according to the first embodiment of the present invention. The configuration of FIG. 8 is different from the configuration of the conventional cell controller IC 100' as shown in FIG. 2 in that the configuration of FIG. 8 includes not only the voltage reference 504 but also a reference voltage generation circuit 500A having a voltage reference 506 and a terminal A14 provided in the switching circuit 501.

In the reference voltage generation circuit 500A, the voltage reference 504 and the voltage reference 506 generate reference voltages Vref1, Vref2, respectively, which are different from each other. More specifically, the − terminal of the voltage reference 504 is connected to the negative electrode terminal of the cell 1, and the voltage reference 504 generates a reference voltage Vref1 using the negative terminal voltage of the cell 1 as the reference. On the other hand, the + terminal of the voltage reference 506 is connected to the positive electrode terminal of the cell 12, and the voltage reference 506 generates a reference voltage Vref2 using the positive terminal voltage of the cell 12 as the reference.

When the cell controller IC 100 of the present embodiment determines whether the cell voltage measurement system is operating normally, the switching circuit 501 selects the terminal A13 and the terminal B12 at the input side, and selects the terminal A1 and the terminal B13 at the input side, which are to be connected with the terminals C1, C2 at the output side. In this manner, the voltage reference 504 and the voltage reference 506 are switched and selected, and the reference voltages Vref1 and Vref2 are output to the differential amplifier circuit 502, so that this changes the reference voltage which is output from the reference voltage generation circuit 500A. Each measurement result for the reference voltages Vref1 and Vref2 at this occasion is transmitted from the cell controller IC 100 to the battery controller 200 of FIG. 1.

When the measurement result of at least one of the measurement results of the reference voltages Vref1 and Vref2 is out of a predetermined range with respect to the reference voltages Vref1, Vref2 determined in advance, the battery controller 200 determines that there is a malfunction in the cell voltage measurement system of the cell controller IC 100. Therefore, even when there is such a malfunction that the error increases only in a particular voltage range in the successive conversion-type AD converter 503, the abnormality of the AD converter 503 can be detected correctly if any one of the reference voltages Vref1 and Vref2 stays within the voltage range.

It should be noted that at least one of the voltage reference 504 and the voltage reference 506 is preferably generated using a voltage substantially matching the overcharge voltage for each cell as the reference voltage Vref1 or Vref2. By doing so, the malfunction detection performance is improved at a voltage around the overcharge voltage, and therefore, the safety in the entire electric storage device can be further improved.

According to the first embodiment of the present invention explained above, the actions and effects as shown in the following (1) to (3) can be achieved.

(1) The cell controller IC 100 monitors the cell group 120 including multiple single battery cells 110 connected in series. This cell controller IC 100 includes the reference voltage generation circuit 500A configured to generate a variable reference voltage, a switching circuit 501 configured to select, as a measurement target voltage, any one of multiple types of voltages including the reference voltage and the cell voltages of the single battery cells 110 of the cell group 120, and an AD converter 503 configured to measure the measurement target voltage selected by the switching circuit 501 and output a digital signal according to the measurement result. The battery controller 200 receives the measurement information according to the digital signal which is output from the AD converter 503 from the cell controller IC 100. Then, the abnormality of the AD converter 503 is detected on the basis of the measurement information when the AD converter 503 measures the reference voltage. In this configuration, the abnormality state can be correctly detected in the measurement system for measuring the cell voltage in the cell controller IC 100.

(2) The reference voltage generation circuit 500A includes the voltage references 504 and 506 generating the reference voltages Vref1, Vref2 different from each other. The cell controller IC 100 causes the switching circuit 501 to switch and select the voltage references 504, 506, so that the reference voltage from the reference voltage generation circuit 500A is changed. In this configuration, the reference voltage can be easily changed with a simple circuit configuration.

(3) At least one of the voltage reference 504 and the voltage reference 506 may generate, as the reference voltage Vref1 or the reference voltage Vref2, a voltage substantially matching the predetermined overcharge voltage for determining overcharging of the single battery cell 110. In this configuration, in a voltage range around the overcharge voltage, the abnormality of the cell voltage measurement system can be detected reliably. Therefore, the safety in the entire electric storage device can be further improved.

In the first embodiment explained above, for example, the reference voltage generation circuit 500A has two voltage references 504 and 506, and generates the reference voltages Vref1, Vref2 from these voltage references using the negative terminal voltage of the cell 1 and the positive terminal voltage of the cell 12 as the references. However, the reference voltages respectively generated by the voltage references 504, 506 are not limited thereto. The reference voltage generation circuit 500A may have three or more voltage references, and may generate the reference voltages different from each other from these voltage references. More specifically, as long as the reference voltage generation circuit 500A has multiple voltage references generating reference voltages different from each other, the reference voltage generation circuit 500A is not limited to the aspect as shown in FIG. 8. Various configurations may be applied as the reference voltage generation circuit 500A.

Second Embodiment

Figure 9:
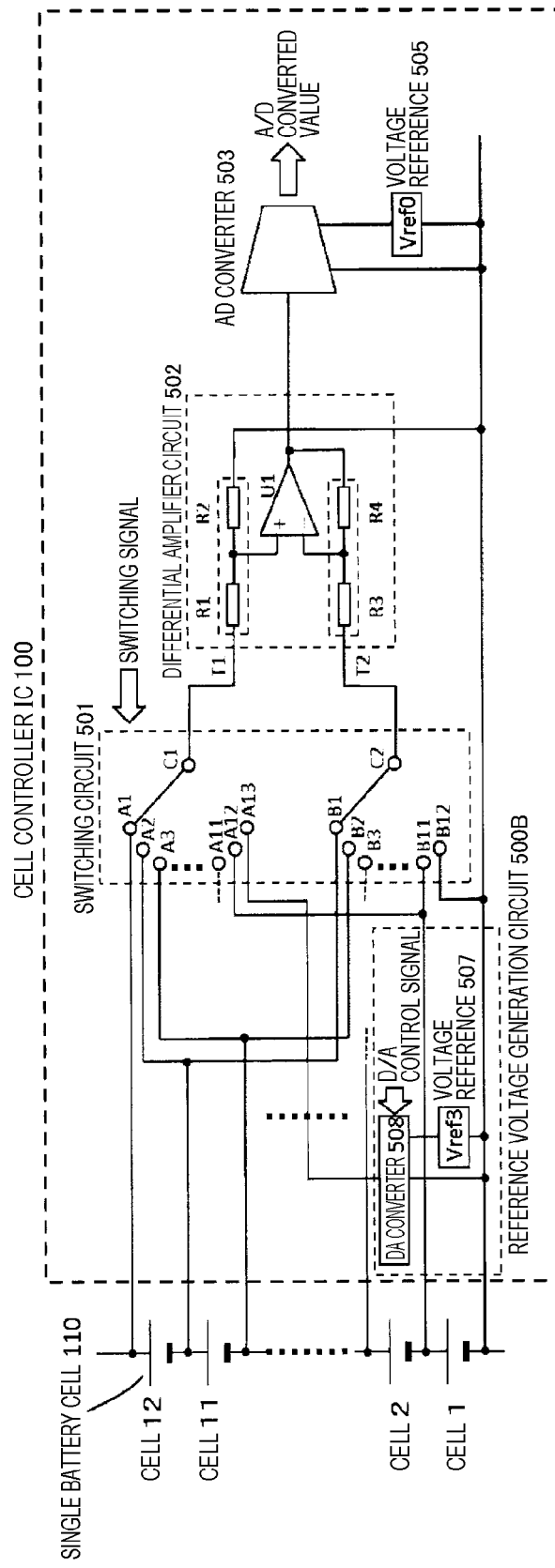
FIG. 9 is a view illustrating an example of a configuration of a cell voltage measurement system of a cell controller IC according to a second embodiment of the present invention.

FIG. 9 is a view illustrating an example of a configuration of a cell voltage measurement system of a cell controller IC 100 according to the second embodiment of the present invention. The configuration of FIG. 9 is different from the configuration of the conventional cell controller IC 100' as shown in FIG. 2 in that the configuration of FIG. 9 includes a reference voltage generation circuit 500B having a DA converter 508 instead of the voltage reference 504.

In the reference voltage generation circuit 500B, the DA converter 508 generates any reference voltage which is set by a logic unit, not shown, on the basis of a reference voltage Vref3 from the voltage reference 507. More specifically, the DA converter 508 operates as a voltage reference generating any reference voltage that is set.

When the cell controller IC 100 of the present embodiment determines whether the cell voltage measurement system is operating normally, the switching circuit 501 selects the terminal A13 and the terminal B12 at the input side which are to be connected with the terminals C1, C2 at the output side. By changing the setting value of the DA converter 508, the reference voltage which is output from the reference voltage generation circuit 500B is changed within a range in which the cell voltage may take. The measurement result of the reference voltage at this occasion is transmitted from the cell controller IC 100 to the battery controller 200 of FIG. 1.

When the measurement result of the reference voltage is out of a predetermined range with respect to the setting value of the DA converter 508, the battery controller 200 determines that there is a malfunction in the cell voltage measurement system of the cell controller IC 100. Therefore, even when there is such a malfunction that the error increases only in a particular voltage range in the successive conversion-type AD converter 503, the abnormality of the AD converter 503 can be detected correctly by causing the DA converter 508 to change the reference voltage in the entire range in which the cell voltage may take.

The malfunction diagnosis of the cell voltage measurement system and the change of the setting value of the DA converter 508 explained above may be done when the cell group 120 is charged or discharged during the usage of the electric storage device. In this case, the diagnosis of the cell voltage measurement system is repeated while the predetermined voltage of the DA converter 508 is changed little by little, so that malfunction of the AD converter 503 can be detected in real time over a wide voltage range.

According to the second embodiment of the present invention explained above, not only the same actions and effects as those associated with (1) explained in the first embodiment but also the actions and effects as shown in (4) below can be achieved.

(4) The reference voltage generation circuit 500B includes the DA converter 508 operating as the voltage reference generating any reference voltage which has been set. In this configuration, the reference voltage can be easily changed in any given voltage range.

Third Embodiment

Figure 10:
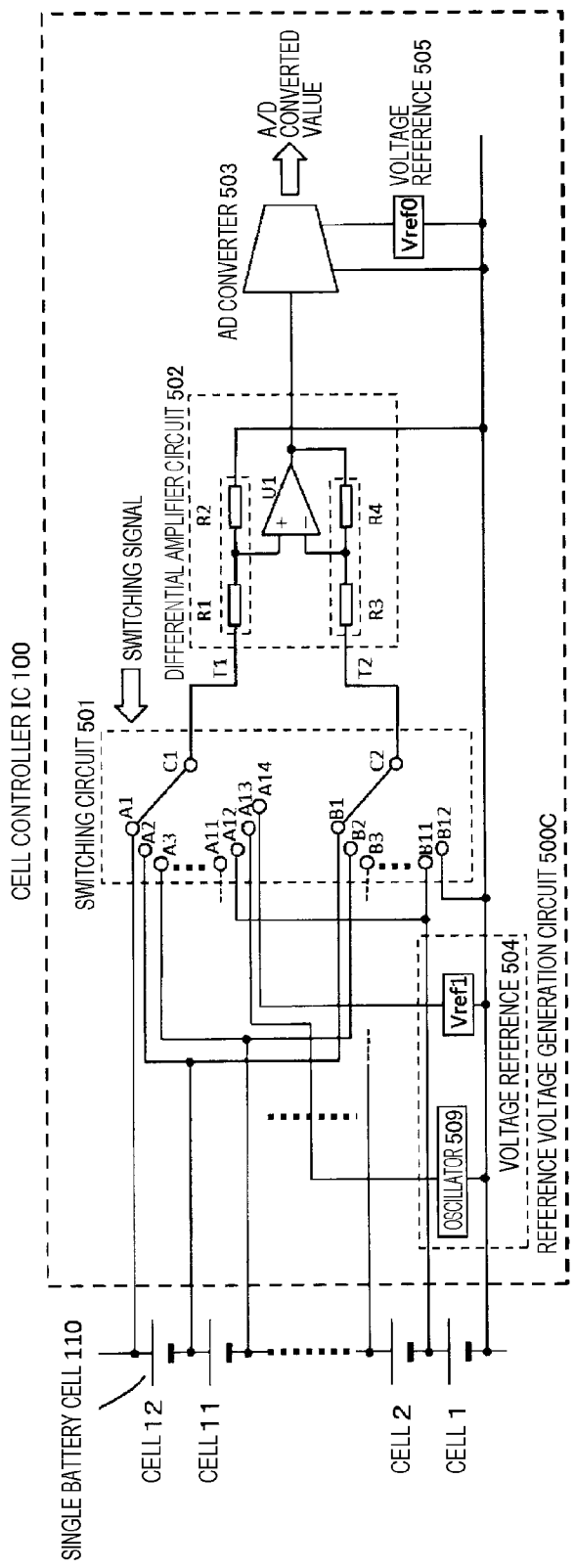
FIG. 10 is a view illustrating an example of a configuration of a cell voltage measurement system of a cell controller IC according to a third embodiment of the present invention.

FIG. 10 is a view illustrating an example of a configuration of a cell voltage measurement system of a cell controller IC 100 according to the third embodiment of the present invention. The configuration of FIG. 10 is different from the configuration of the conventional cell controller IC 100' as shown in FIG. 2 in that the configuration of FIG. 10 includes a reference voltage generation circuit 500C having not only a voltage reference 504 but also an oscillator 509.

In the reference voltage generation circuit 500C, the oscillator 509 generates a reference voltage which changes within a predetermined voltage range as the time elapses. The period in which the oscillator 509 changes the reference voltage is preferably, sufficiently longer than the measurement period of the measurement target voltage of the AD converter 503. The range in which the oscillator 509 changes the reference voltage preferably includes the range which the cell voltage may take. It should be noted that the reference voltage waveform from the oscillator 509 may be a waveform that changes periodically within a predetermined range such as a triangular wave and a sine wave.

When the cell controller IC 100 of the present embodiment determines whether the cell voltage measurement system is operating normally, the switching circuit 501 selects the terminal A13 and the terminal B12 at the input side, and selects the terminal A14 and the terminal B12 at the input side, which are to be connected with the terminals C1, C2 at the output side. When the terminal A13 and the terminal B12 are selected, the reference voltage from the oscillator 509 changing periodically is measured, and when the terminal A13 and the terminal B12 are selected, the reference voltage Vref1 given by the voltage reference 504 is measured. These measurement results of the reference voltages are transmitted from the cell controller IC 100 to the battery controller 200 of FIG. 1.

When the measurement result of the reference voltage Vref1 is within a predetermined range and the measurement result of the reference voltage from the oscillator 509 monotonically changes in accordance with the reference voltage waveform, the battery controller 200 determines that the cell voltage measurement system of the cell controller IC 100 is normal. On the other hand, when measurement result of the reference voltage Vref1 is out of a predetermined range, or when the change in the measurement result of the reference voltage from the oscillator 509 is different from the reference voltage waveform, the battery controller 200 determines that there is a malfunction in the cell voltage measurement system of the cell controller IC 100. Therefore, even when there is a malfunction explained above in which the error of the successive conversion-type AD converter 503 increases only in a particular voltage range, the oscillator 509 periodically changes the reference voltage, so that the abnormality of the AD converter 503 can be detected correctly.

According to the third embodiment of the present invention explained above, not only the same actions and effects as those associated with (1) explained in the first embodiment but also the actions and effects as shown in (5), (6) below can be achieved.

(5) The reference voltage generation circuit 500C includes the oscillator 509 serving as the voltage reference generating the reference voltage that changes within a predetermined voltage range as the time elapses. Therefore, the reference voltage can be easily changed in any voltage range.

(6) The oscillator 509 periodically changes the reference voltage, and therefore, a determination as to whether the AD converter 503 is abnormal or not can be easily determined from the change in the measurement result of the reference voltage.

Fourth Embodiment

Figure 11:
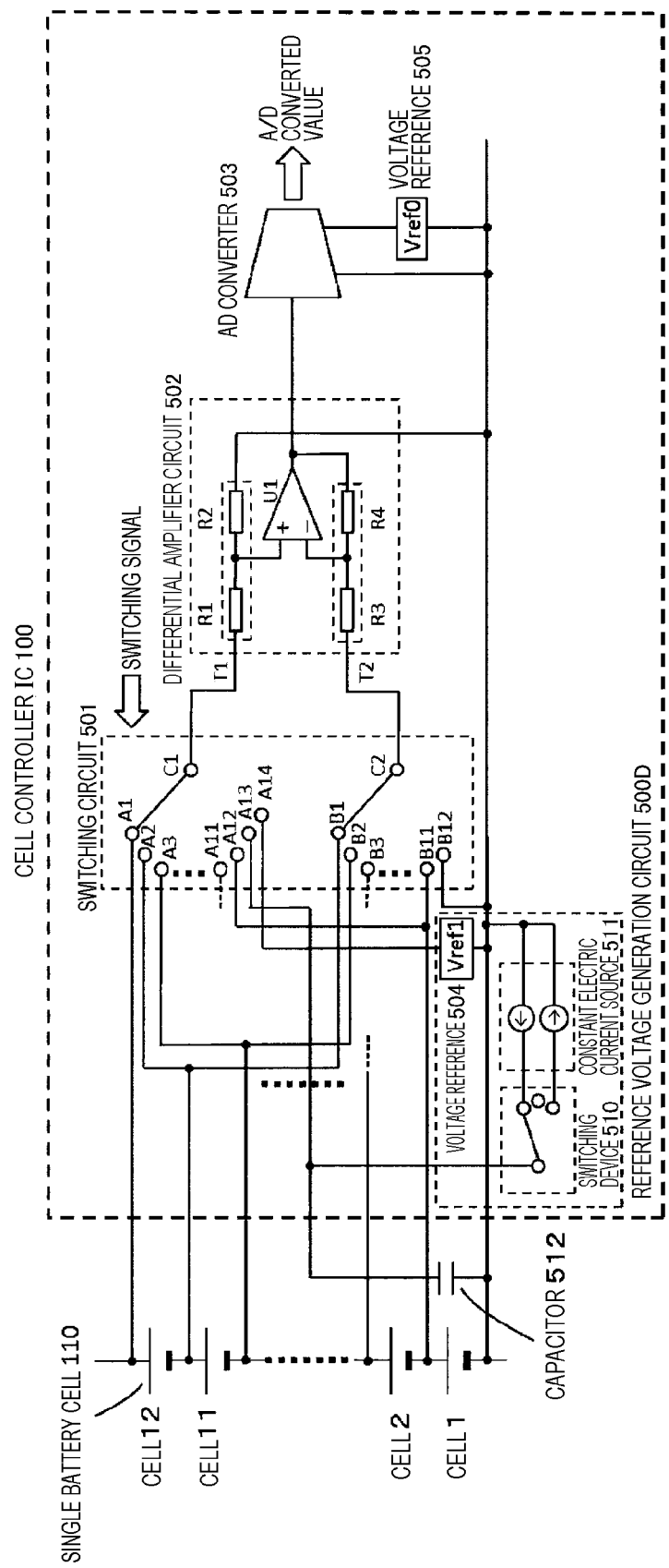
FIG. 11 is a view illustrating an example of a configuration of a cell voltage measurement system of a cell controller IC according to a fourth embodiment of the present invention.

FIG. 11 is a view illustrating an example of a configuration of a cell voltage measurement system of a cell controller IC 100 according to the fourth embodiment of the present invention. The configuration of FIG. 11 is different from the configuration of the conventional cell controller IC 100' as shown in FIG. 2 in that the configuration of FIG. 11 includes a reference voltage generation circuit 500D having not only the voltage reference 504 but also a switching device 510 and a constant electric current source 511, and has a capacitor 512 provided outside of the cell controller IC 100.

In the reference voltage generation circuit 500D, the switching device 510 is provided between the capacitor 512 and the constant electric current source 511. The switching state of the switching device 510 is controlled so that an electric current is passed from the constant electric current source 511 to the capacitor 512 to charge the capacitor 512 and thereafter an electric current is passed in the opposite direction to discharge the capacitor 512. Therefore, the voltage across the capacitor 512 changes within a predetermined voltage range as the time passes.

In general, many switches and constant electric current sources used for various purposes are provided in the cell controller IC. Therefore, when these are used as the switching device 510 and the constant electric current source 511, the cell voltage measurement system as shown in FIG. 11 can be easily made by just externally adding the capacitor 512.

When the cell controller IC 100 of the present embodiment determines whether the cell voltage measurement system is operating normally, the switching circuit 501 selects the terminal A13 and the terminal B12 at the input side, and selects the terminal A14 and the terminal B12 at the input side, which are to be connected with the terminals C1, C2 at the output side. When the terminal A13 and the terminal B12 are selected, the switching state of the switching device 510 is controlled as described above to charge and discharge the capacitor 512, and the voltage across the capacitor 512 that changes according to the charge/discharge state thereof is measured as the reference voltage. When the terminal A13 and the terminal B12 are selected, the reference voltage Vref1 given by the voltage reference 504 is measured. The measurement result of the reference voltage is transmitted from the cell controller IC 100 to the battery controller 200 of FIG. 1.

When the measurement result of the reference voltage Vref1 is within a predetermined range, and the measurement result of the voltage across the capacitor 512 measured as the reference voltage monotonically changes according to the switching state of the switching device 510, the battery controller 200 determines that the cell voltage measurement system of the cell controller IC 100 is normal. On the other hand, when the measurement result of the reference voltage Vref1 is out of the predetermined range, or when the change in the measurement result of the voltage across the capacitor 512 does not correspond to the switching state of the switching device 510, the battery controller 200 determines that there is a malfunction in the cell voltage measurement system of the cell controller IC 100. Therefore, even when there is a malfunction explained above in which the error of the successive conversion-type AD converter 503 increases only in a particular voltage range, the capacitor 512 is charged and discharged to change the voltage across the capacitor 512, so that the abnormality of the AD converter 503 can be detected correctly.

According to the fourth embodiment of the present invention explained above, not only the same actions and effects as those associated with (1) explained in the first embodiment but also the actions and effects as shown in (7) below can be achieved.

(7) The reference voltage generation circuit 500D uses the switching device 510 and the constant electric current source 511 to output the voltage across the capacitor 512 that is charged or discharged as the reference voltage, so that the reference voltage is generated, which changes within the predetermined voltage range as the time elapses. Therefore, the reference voltage is changed in accordance with the measurement timing of the reference voltage, and a determination as to whether the AD converter 503 is abnormal or not can be made easily.

Fifth Embodiment

Figure 12:
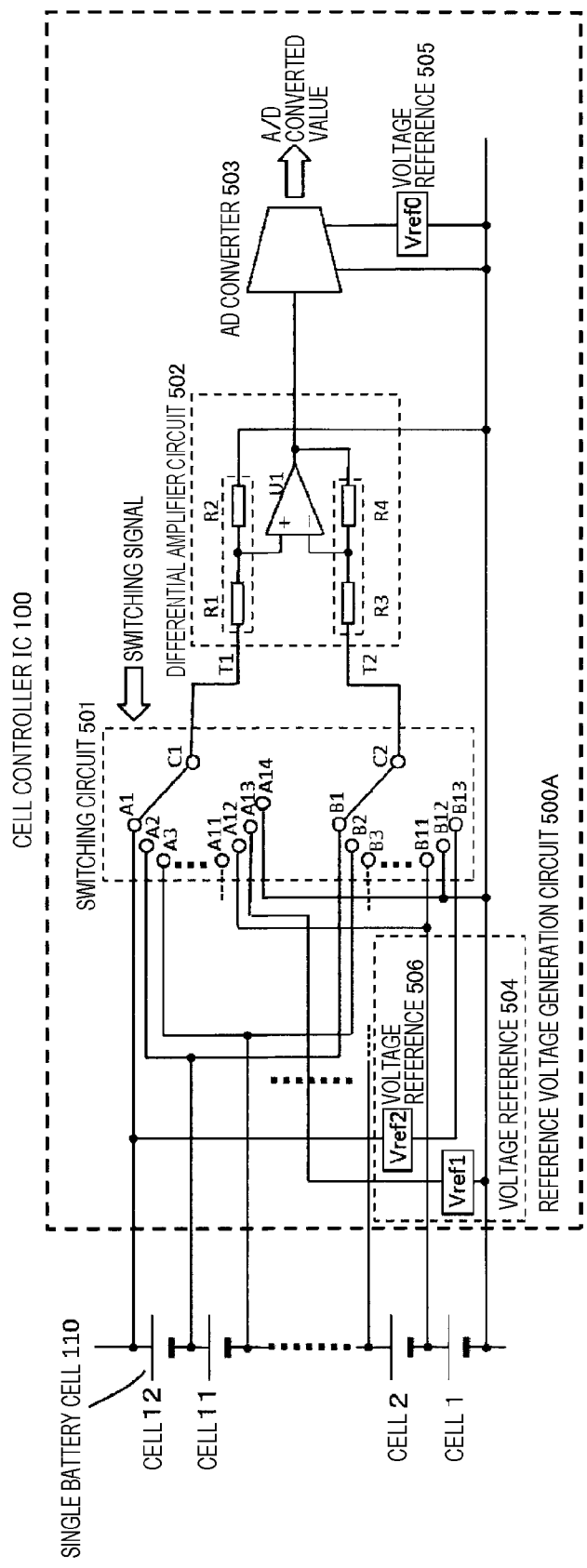
FIG. 12 is a view illustrating an example of a configuration of a cell voltage measurement system of a cell controller IC according to a fifth embodiment of the present invention.

FIG. 12 is a view illustrating an example of a configuration of a cell voltage measurement system of a cell controller IC 100 according to the fifth embodiment of the present invention. The configuration of FIG. 12 is different from the configuration of the conventional cell controller IC 100' as shown in FIG. 2 in that the configuration of FIG. 12 includes a reference voltage generation circuit 500A having not only the voltage reference 504 but also a voltage reference 506, and the switching circuit 501 is provided with a terminal A14 for connecting the input terminal T1 of the differential amplifier circuit 502 to the ground voltage. The configuration of the cell voltage measurement system as shown in FIG. 12 is the same as the configuration of the cell voltage measurement system of the cell controller IC 100 according to the first embodiment as shown in FIG. 8.

FIG. 13 is a list table illustrating connection in the switching circuit 501 when the cell voltages of the cells 1 to 12, the reference voltages Vref1, Vref2 from the voltage references 504, 506, and the negative terminal voltage of the cell 1, i.e., the ground voltage are selected in the cell controller IC 100 according to the fifth embodiment of the present invention. As shown in the table, by switching the connections of the upper side and the lower side of the switching circuit 501, the cell voltages of the cells 1 to 12 and the reference voltages Vref1, Vref2 can be selectively applied to between the input terminal T1 and the input terminal T2 of the differential amplifier circuit 502. Both of the input terminal T1 and the input terminal T2 are connected to the ground voltage, and they can be short-circuited.

In the cell controller IC 100 of the present embodiment, the AD converter 503 measures the voltage into which the differential amplifier circuit 502 converts the reference voltage Vref2 from the voltage reference 506 as the abnormality detection voltage for detecting the abnormality of the differential amplifier characteristics of the differential amplifier circuit 502. At this occasion, the switching circuit 501 selects the terminal A1 and the terminal B13 at the input side which are connected to the terminals C1, C2 at the output side. Therefore, the reference voltage Vref2 from the voltage reference 506 is selected and input into the differential amplifier circuit 502, and the voltage into which the differential amplifier circuit 502 converts the reference voltage Vref2 is output to the AD converter 503 as the abnormality detection voltage. The measurement information obtained when the AD converter 503 measured the abnormality detection voltage is transmitted from the cell controller IC 100 to the battery controller 200 of FIG. 1.

Further, in the cell controller IC 100 of the present embodiment, when the measurement result of the abnormality detection voltage indicates abnormality, an offset error and a gain error are measured in order to determine whether the abnormality occurs in the differential amplifier characteristics of the differential amplifier circuit 502. The offset error is an error caused by an offset voltage of the differential amplifier circuit 502 and the AD converter 503, and the gain error is an error for the gain of the differential amplifier circuit 502 and the AD converter 503. When all the measurement values of these errors are within a predetermined error range, and the measurement result of the abnormality detection voltage indicates abnormality, then the resistance values of the resistors R1 to R4 of the differential amplifier circuit 502 change as described above and it can be determined that there is an abnormality in the differential amplifier characteristics.

When the offset error is measured, the switching circuit 501 selects the terminal A14 and the terminal B12 at the input side which are connected to the terminals C1, C2 at the output side. Therefore, both of the input terminals T1 and T2 of the differential amplifier circuit 502 are connected to the negative electrode-side of the cell 1 at the lowest potential in the cell group 120, so that the input terminal T1 and the input terminal T2 are short-circuited. The output voltage from the differential amplifier circuit 502 at this occasion, i.e., the output when the ground voltage is input into the differential amplifier circuit 502, is output to the AD converter 503 as the offset error voltage for measuring the offset error. The measurement information obtained when the offset error voltage is measured by the AD converter 503 is also transmitted from the cell controller IC 100 to the battery controller 200 of FIG. 1.

When the gain error is measured, the switching circuit 501 selects the terminal A13 and the terminal B12 at the input side which are connected to the terminals C1, C2 at the output side. Therefore, the reference voltage Vref1 given by the voltage reference 504 is selected, and is input into the differential amplifier circuit 502. The voltage into which the differential amplifier circuit 502 converts the reference voltage Vref1 is output to the AD converter 503 as the gain error voltage for measuring the gain error. The measurement information obtained when the AD converter 503 measures the gain error voltage is also transmitted from the cell controller IC 100 to the battery controller 200 of FIG. 1.

The battery controller 200 detects the abnormality of the differential amplifier characteristics of the differential amplifier circuit 502 on the basis of the measurement information of the abnormality detection voltage, offset error voltage and gain error voltage transmitted from the cell controller IC 100 as described above. At this occasion, the battery controller 200 measures the offset error and the gain error on the basis of the measurement information from the cell controller IC 100 when the offset error voltage is measured and the measurement information from the cell controller IC 100 when the gain error voltage is measured. As a result, when all of these errors are within a predetermined error range, and the value of the measurement information obtained when the abnormality detection voltage is measured is out of a predetermined range with respect to the previously determined reference voltage Vref2, then the battery controller 200 determines that there is an abnormality in the differential amplifier characteristics of the differential amplifier circuit 502 in the cell controller IC 100. Therefore, the abnormality in the differential amplifier characteristics caused by the change in the resistance values of the resistors R1 to R4 of the differential amplifier circuit 502 can be detected correctly.

On the other hand, when the offset error and the gain error are within a predetermined error range, and the value of the measurement information obtained when the abnormality detection voltage is measured is within a predetermined range, then the battery controller 200 determines that the cell voltage measurement system of the cell controller IC 100 is normal. When the offset error and the gain error are out of the predetermined error range, it is determined that the offset abnormality or the gain abnormality occurs in at least one of the differential amplifier circuit 502 and the AD converter 503. Therefore, the abnormality of the cell voltage measurement system can be detected in details.

According to the fifth embodiment of the present invention explained above, the actions and effects as shown in the following (8) to (10) can be achieved.

(8) The cell controller IC 100 monitors the cell group 120 having multiple single battery cells 110 connected in series. This cell controller IC 100 includes a switching circuit 501 configured to select, as the measurement target voltage, any one of multiple types of voltages including the cell voltages of the single battery cells 110 of the cell group 120, a differential amplifier circuit 502 including input terminals T1 and T2 and configured to differential amplifies the measurement target voltage which is selected by the switching circuit 501 and is input to between the input terminal T1 and the input terminal T2, and convert the measurement target voltage into a voltage in a predetermined range, and an AD converter 503 configured to measure the measurement target voltage which is selected by the switching circuit 501 and converted by the differential amplifier circuit 502, and output a digital signal according to the measurement result, wherein an abnormality detection voltage for detecting abnormality in differential amplifier characteristics of the differential amplifier circuit 502 is output to the AD converter 503. The battery controller 200 receives the measurement information according to the digital signal which is output from the AD converter 503 from the cell controller IC 100. Then, on the basis of the measurement information obtained when the AD converter 503 measures the abnormality detection voltage, the abnormality in the differential amplifier characteristics of the differential amplifier circuit 502 is detected. Therefore, the abnormality state can be detected correctly in the measurement system for measuring the cell voltage.

(9) The cell controller IC 100 includes the voltage reference 506 configured to generate the reference voltage Vref2, and causes the switching circuit 501 to select the reference voltage Vref2, so that the reference voltage Vref2 converted by the differential amplifier circuit 502 is output to the AD converter 503 as the abnormality detection voltage. Therefore, by using the circuit configuration for detecting the abnormality of the AD converter 503 explained in the first embodiment, the abnormality detection voltage can be output.

(10) The cell controller IC 100 includes a voltage reference 504 connected to the negative electrode-side of the cell 1 of the lowest potential in the cell group 120, and configured to generate the reference voltage Vref1 using the potential of the negative electrode-side of the cell 1 as the reference. Then, the output voltage from the differential amplifier circuit 502 obtained when both of the input terminals T1 and T2 are connected to the negative electrode-side of the cell 1 by the switching circuit 501 to short-circuit the input terminal T1 and the input terminal T2 is output to the AD converter 503 as the offset error voltage. By causing the switching circuit 501 to select the reference voltage Vref1, the reference voltage Vref1 converted by the differential amplifier circuit 502 is output to the AD converter 503 as the gain error voltage. The battery controller 200 measures the offset error of the differential amplifier circuit 502 and the AD converter 503 on the basis of the measurement information obtained when the AD converter 503 measures the offset error voltage. The gain error of the differential amplifier circuit 502 and the AD converter 503 is measured on the basis of the measurement information obtained when the AD converter 503 measures the gain error voltage. Then, when the offset error is within the predetermined error range, and the gain error is within the predetermined error range, and the value of the measurement information obtained when the AD converter 503 measures the abnormality detection voltage is out of the predetermined range, the differential amplifier characteristics of the differential amplifier circuit 502 is determined to be abnormal. Therefore, where there is an abnormality in the differential amplifier characteristics of the differential amplifier circuit 502, this can be reliably detected.

In the fifth embodiment explained above, for example, the + terminal of the voltage reference 506 is connected to the positive electrode-side of the cell 12, and the voltage reference 506 generates the reference voltage Vref2 using the positive terminal voltage of the cell 12 as the reference. However, the embodiment is not limited thereto as long as the reference voltage generated by the voltage reference 506 is based on a voltage higher than the reference voltage Vref1 generated by the voltage reference 504. More specifically, the voltage reference 506 is connected to the positive electrode-side or the negative electrode-side of any one of the cells in the cell group 120 except the negative electrode-side of the cell 1 of the lowest potential in the cell group 120, and can generate, as the reference voltage Vref2, any given voltage using the potential of the positive electrode-side or the negative electrode-side of the cell as the reference.

Sixth Embodiment

Figure 14:
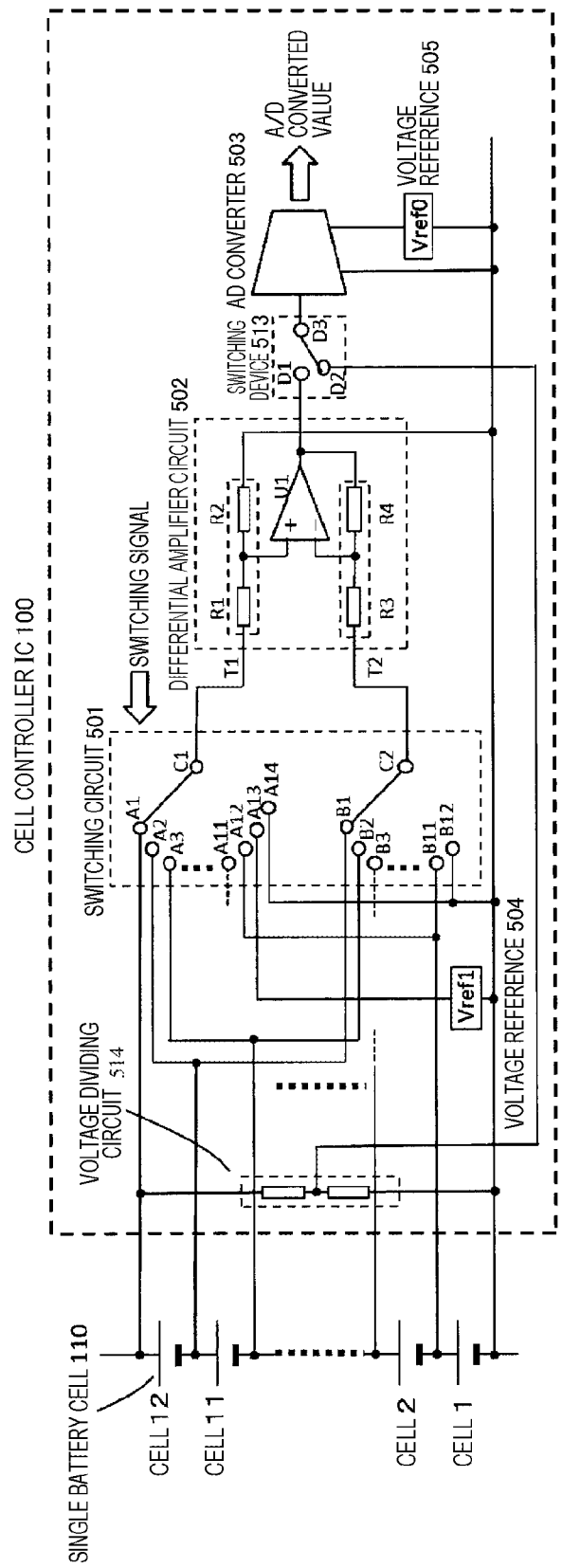
FIG. 14 is a view illustrating an example of a configuration of a cell voltage measurement system of a cell controller IC according to a sixth embodiment of the present invention.

FIG. 14 is a view illustrating an example of a configuration of a cell voltage measurement system of a cell controller IC 100 according to the sixth embodiment of the present invention. This configuration of FIG. 14 is different from the configuration of the conventional cell controller IC 100' as shown in FIG. 2 in that the configuration of FIG. 14 includes a voltage dividing circuit 514 and a switching device 513, and the switching circuit 501 is provided with a terminal A14 for connecting the input terminal T1 of the differential amplifier circuit 502 to the ground voltage.

The voltage dividing circuit 514 is connected between the positive electrode-side of the cell 12 and the negative electrode-side of the cell 1, and outputs the voltage difference, and more specifically, the voltage dividing circuit 514 outputs the divided voltage according to the voltage of the cell group 120 constituted by the cells 1 to 12 (cell group voltage). The switching device 513 selects any one of the divided voltage output from the voltage dividing circuit 514 and the output voltage from the differential amplifier circuit 502, and outputs it to the AD converter 503.

FIG. 15 is a list table illustrating the connection in the switching circuit 501 and the connection in the switching device 513 for selection of the divided voltage according to the cell group voltage when the cell voltages of the cells 1 to 12, the reference voltage Vref1 given by the voltage reference 504, and the negative terminal voltage of the cell which is the ground voltage are selected in the cell controller IC 100 according to the sixth embodiment according to the present invention. As shown in the table, the connections of the upper side and the lower side of the switching circuit 501 are switched, the cell voltages of the cells 1 to 12 and the reference voltage Vref1 can be selectively applied to between the input terminal T1 and the input terminal T2 of the differential amplifier circuit 502. Both of the input terminal T1 and the input terminal T2 can be connected to the ground voltage to be short-circuited. Further, by switching the connection of the switching device 513, not only the output voltage from the differential amplifier circuit 502 but also the divided voltage which is output from the voltage dividing circuit 514 can be output to the AD converter 503.

In the cell controller IC 100 of the present embodiment, the AD converter 503 measures the divided voltage given by the voltage dividing circuit 514 as the abnormality detection voltage for detecting the abnormality in the differential amplifier characteristics of the differential amplifier circuit 502. At this occasion, the switching device 513 selects the terminal D2 at the input side which is connected to the terminal D3 at the output side. Therefore, the divided voltage from the voltage dividing circuit 514 is selected, and the divided voltage which is output without passing through the differential amplifier circuit 502 is output to the AD converter 503 as the abnormality detection voltage. The measurement information obtained when the abnormality detection voltage is measured by the AD converter 503 is transmitted from the cell controller IC 100 to the battery controller 200 of FIG. 1.

Further, in the cell controller IC 100 of the present embodiment, like what has been explained in the fifth embodiment, the offset error and the gain error are measured. More specifically, the output obtained when the input terminal T1 and the input terminal T2 are short-circuited to input the ground voltage into the differential amplifier circuit 502 is output to the AD converter 503 as the offset error voltage. The voltage obtained when the reference voltage Vref1 given by the voltage reference 504 is converted by the differential amplifier circuit 502 is output to the AD converter 503 as the gain error voltage. The measurement information obtained when these voltages are measured is also transmitted from the cell controller IC 100 to the battery controller 200 of FIG. 1.

The battery controller 200 calculates the cell group voltage on the basis of the measurement information about the abnormality detection voltage transmitted from the cell controller IC 100. The cell group voltage and the total summation of the measurement values of the cell voltages are compared, and when the difference is out of a predetermined range, the differential amplifier characteristics of the differential amplifier circuit 502 in the cell controller IC 100 is determined to be abnormal. More specifically, the divided voltage from the voltage dividing circuit 514 is output to the AD converter 503 as the abnormality detection voltage without passing through the differential amplifier circuit 502, so that the cell controller IC 100 transmits the measurement information not including any error caused by the differential amplifier characteristics of the differential amplifier circuit 502. Therefore, the cell group voltage calculated based on the measurement information and the total summation of the measurement values of the cell voltages measured by the differential amplifier circuit 502 are compared, and a determination can be made as to whether the differential amplifier characteristics of the differential amplifier circuit 502 is abnormal or not.

Further, the battery controller 200 measures the offset error and the gain error in accordance with the same method as what has been explained in the fifth embodiment. More specifically, the offset error and the gain error are measured on the basis of the measurement information from the cell controller IC 100 obtained when the offset error voltage is measured and the measurement information from the cell controller IC 100 obtained when the gain error voltage is measured.

When all of the offset error and the gain error are within the predetermined error range, and the value of the measurement information when the abnormality detection voltage is measured is out of the predetermined range with respect to the total summation of the measurement values of the cell voltages, the battery controller 200 determines that the differential amplifier characteristics of the differential amplifier circuit 502 in the cell controller IC 100 is abnormal. Therefore, the abnormality of the differential amplifier characteristics caused by the change in the resistance values of the resistors R1 to R4 of the differential amplifier circuit 502 can be detected correctly.

On the other hand, when the offset error and the gain error are within the predetermined error range, and the value of the measurement information obtained when the abnormality detection voltage is measured is within the predetermined range, the battery controller 200 determines that the cell voltage measurement system of the cell controller IC 100 is normal. When the offset error and the gain error are out of the predetermined error range, it is determined that the offset abnormality or the gain abnormality occurs in at least one of the differential amplifier circuit 502 and the AD converter 503. Therefore, the abnormality of the cell voltage measurement system can be detected in details.

According to the sixth embodiment according to the present invention explained above, not only the same actions and effects as those associated with (8) and (10) explained in the fifth embodiment but also the actions and effects as shown in (11) below can be achieved.

(11) The cell controller IC 100 includes the voltage dividing circuit 514 connected between the positive electrode-side of the cell 12 of the highest potential in the cell group 120 and the negative electrode-side of the cell 1 of the lowest potential therein and configured to output the divided voltage according to the cell group voltage, and the switching device 513 configured to select anyone of the divided voltage which is output from the voltage dividing circuit 514 and the output voltage from the differential amplifier circuit 502 and outputs the selected voltage to the AD converter 503. When the switching device 513 selects the divided voltage, the divided voltage which is output without passing through the differential amplifier circuit 502 is output to the AD converter 503 as the abnormality detection voltage. Therefore, the abnormality detection voltage with which it is possible to determine appropriately whether the differential amplifier characteristics of the differential amplifier circuit 502 is abnormal or not can be output.

Seventh Embodiment

Figure 16:
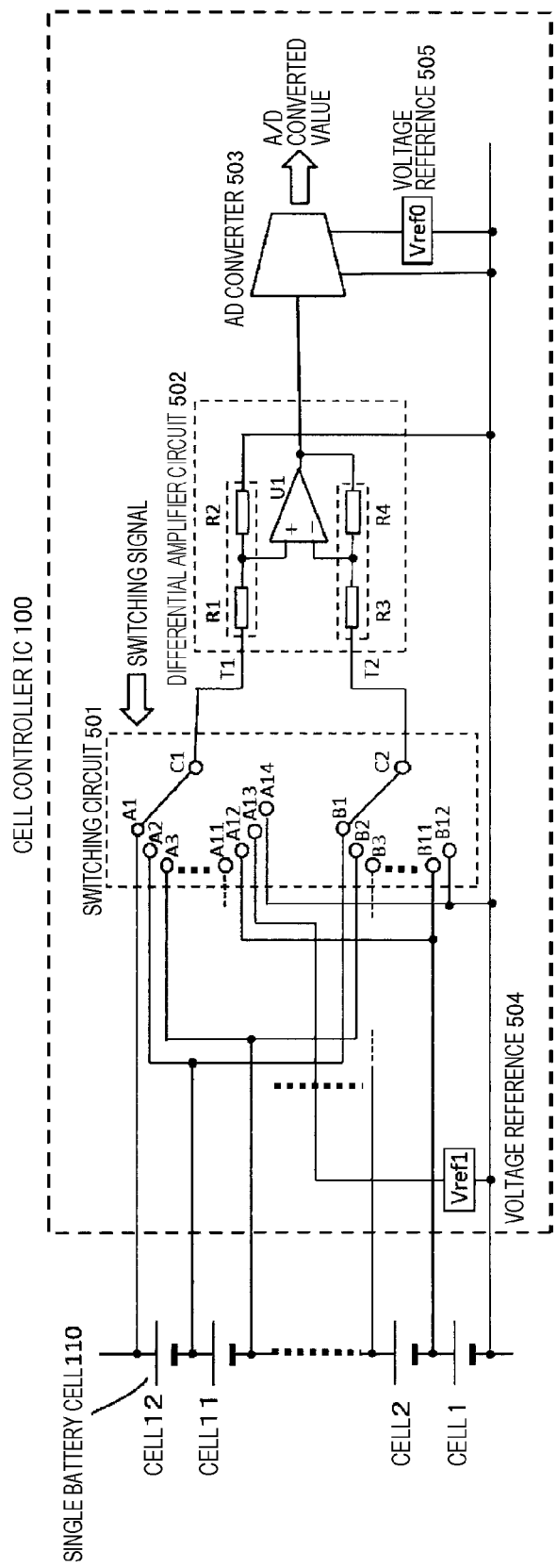
FIG. 16 is a view illustrating an example of a configuration of a cell voltage measurement system of a cell controller IC according to the seventh embodiment of the present invention.

FIG. 16 is a view illustrating an example of a configuration of a cell voltage measurement system of a cell controller IC 100 according to the seventh embodiment of the present invention. The configuration of FIG. 16 is different from the configuration of the conventional cell controller IC 100' as shown in FIG. 2 in that the switching circuit 501 is provided with a terminal A14 for connecting the input terminal T1 of the differential amplifier circuit 502 to the ground voltage.

FIG. 17 is a list table illustrating connections in the switching circuit 501 when the cell voltages of the cells 1 to 12, the reference voltage Vref1 given by the voltage reference 504, the negative terminal voltage of the cell 1, i.e., the ground voltage, and the negative terminal voltage of the cell 12 are selected in the cell controller IC 100 according to the seventh embodiment of the present invention. As shown in the table, the connections of the upper side and the lower side of the switching circuit 501 are switched respectively, so that the cell voltages of the cells 1 to 12 and the reference voltage Vref1 can be selectively applied to between the input terminal T1 and the input terminal T2 of the differential amplifier circuit 502. In addition, both of the input terminal T1 and the input terminal T2 can be connected to the ground voltage or the negative electrode terminal of the cell 12 to be short-circuited.

In the cell controller IC 100 of the present embodiment, both of the input terminals T1 and T2 of the differential amplifier circuit 502 are connected to the negative electrode-side of the cell 12 so that the input terminal T1 and the input terminal T2 are short-circuited. The output voltage from the differential amplifier circuit 502 at this occasion is measured by the AD converter 503 as the abnormality detection voltage with which the abnormality of the differential amplifier characteristics of the differential amplifier circuit 502 is detected. At this occasion, the switching circuit 501 selects the terminal A2 and the terminal B1 at the input side which are connected to the terminals C1, C2 at the output side. The measurement information obtained when the abnormality detection voltage is measured by the AD converter 503 is transmitted from the cell controller IC 100 to the battery controller 200 of FIG. 1.

FIG. 18 is a figure illustrating an example of a characteristics chart showing a relationship between a voltage detection error and a cell position when there is a change in the resistance values of the resistors R1 to R4 of the differential amplifier circuit 502 and the input terminals T1 and T2 of the differential amplifier circuit 502 are connected to the negative electrode-side of the same cell to be short-circuited. The characteristics charts indicated by reference symbols 801, 802 indicate the relationships between the voltage detection error and the cell position when the cell voltage of each cell is 4.1 V, and the voltage dividing ratio at the side of the + input terminal of the differential amplifier U1 and the voltage dividing ratio at the side of the − input terminal of the differential amplifier U1 change from 50% by ±0.2%. More specifically, the characteristics chart 801 shows the relationship between the voltage detection error and the cell position when the voltage dividing ratio of the + input terminal or the − input terminal of the differential amplifier U1 is 49.8%. On the other hand, the characteristics chart 802 shows the relationship between the voltage detection error and the cell position when the voltage dividing ratio of the + input terminal or the − input terminal of the differential amplifier U1 is 50.2%.

In FIG. 18, in each of the characteristics charts 801, 802, a cell which is connected to an upper side and of which potential is high has a higher voltage detection error. More specifically, it is understood that in a case where the output voltage from the differential amplifier circuit 502 obtained when both of the input terminals T1 and T2 are connected to the positive electrode-side or the negative electrode-side of any one of the cells to be short-circuited is output as the abnormality detection voltage, then, the detected error increases when the position of the cell is at an upper side. Therefore, the abnormality of the differential amplifier characteristics of the differential amplifier circuit 502 can be more easily detected. Therefore, as described above, in the present embodiment, both of the input terminals T1 and T2 of the differential amplifier circuit 502 are connected to the negative electrode-side of the most-upstream cell 12, and the output voltage from the differential amplifier circuit 502 at this occasion is output to the AD converter 503 as the abnormality detection voltage.

Further, in the cell controller IC 100 of the present embodiment, like what has been explained in the fifth embodiment, the offset error and the gain error are measured. More specifically, the output that occurs when the input terminal T1 and the input terminal T2 are short-circuited and the ground voltage is input into the differential amplifier circuit 502 is output to the AD converter 503 as the offset error voltage. The voltage into which the reference voltage Vref1 given by the voltage reference 504 is converted by the differential amplifier circuit 502 is output to the AD converter 503 as the gain error voltage. The measurement information obtained when these voltages are measured is also transmitted from the cell controller IC 100 to the battery controller 200 of FIG. 1.

The battery controller 200 detects the abnormality of the differential amplifier characteristics of the differential amplifier circuit 502 on the basis of each measurement information about the abnormality detection voltage, the offset error voltage, and the gain error voltage transmitted from the cell controller IC 100. At this occasion, the battery controller 200 measures the offset error and the gain error in accordance with the same method as that has been explained in the fifth embodiment. More specifically, each of the offset error and the gain error is measured on the basis of the measurement information from the cell controller IC 100 obtained when the offset error voltage is measured and the measurement information from the cell controller IC 100 obtained when the gain error voltage is measured.

When both of the offset error and the gain error are within a predetermined error range, and the value of the measurement information obtained when the abnormality detection voltage is measured is out of a predetermined range, then the battery controller 200 determines that the differential amplifier characteristics of the differential amplifier circuit 502 is abnormal in the cell controller IC 100. Therefore, the abnormality in the differential amplifier characteristics caused by the change in the resistance values of the resistors R1 to R4 of the differential amplifier circuit 502 can be correctly detected.

On the other hand, when the offset error and the gain error are within the predetermined error range, and the value of the measurement information obtained when the abnormality detection voltage is measured is within the predetermined range, the battery controller 200 determines that the cell voltage measurement system of the cell controller IC 100 is normal. In a case where the offset error and the gain error are out of the predetermined error range, it is determined that the offset abnormality or the gain abnormality occurs in at least one of the differential amplifier circuit 502 and the AD converter 503. Therefore, the abnormality of the cell voltage measurement system can be detected in details.

According to the seventh embodiment of the present invention explained above, not only the same actions and effects as those associated with (8) and (10) explained in the fifth embodiment but also the actions and effects as shown in (12) below can be achieved.

(12) The cell controller IC 100 causes the switching circuit 501 to connect both of the input terminals T1 and T2 to the negative electrode-side of the cell 12, and the output voltage from the differential amplifier circuit 502 obtained when the input terminal T1 and the input terminal T2 are short-circuited is output to the AD converter 503 as the abnormality detection voltage. Therefore, without providing any independent voltage reference such as the voltage reference 506 explained in the fifth embodiment, the abnormality detection voltage can be output, with which it is possible to determine appropriately whether the differential amplifier characteristics of the differential amplifier circuit 502 is abnormal or not.

In the seventh embodiment explained above, for example, both of the input terminals T1 and T2 are connected to the negative electrode-side of the cell 12 to be short-circuited, so that the abnormality detection voltage is output to the AD converter 503. However, the position of the cell connected to the input terminals T1 and T2 is not limited thereto as long as the abnormality voltage detection error according to the change of the resistance value is output as the measurement result of the abnormality detection voltage when the resistance values of the resistors R1 to R4 of the differential amplifier circuit 502 change and the differential amplifier characteristics become abnormal. More specifically, both of the input terminals T1 and T2 are connected to the positive electrode-side or the negative electrode-side of anyone of the cells of the cell group 120 except the negative electrode-side of the cell 1 of the lowest potential in the cell group 120, so that the input terminals T1 and T2 are short-circuited, and the output voltage from the differential amplifier circuit 502 at this occasion can be output to the AD converter 503 as the abnormality detection voltage.

It should be noted that each of the embodiments explained above is an example of embodiments of the present invention. The present invention is not limited to these embodiments. A person skilled in the art can make various modifications without losing the features of the present invention. Therefore, other aspects that can be conceived of within the technical concept of the present invention are also included in the scope of the present invention.

The invention claimed is:

1. A battery monitoring device for monitoring a cell group made by connecting a plurality of single battery cells in series, comprising:
    a reference voltage generation circuit configured to generate a variable reference voltage;
    a switching circuit configured to select, as a measurement target voltage, any one of a plurality of types of voltages including the cell voltages of the single battery cells in the cell group and the variable reference voltage; and
    an AD converter configured to measure the measurement target voltage which is selected by the switching circuit, and output a digital signal according to the measurement result,
    wherein the reference voltage generation circuit includes a voltage reference configured to generate a reference voltage according to a set reference voltage value.

2. The battery monitoring device according to claim 1, wherein the reference voltage generation circuit includes a plurality of voltage references, each voltage reference configured to generate a different reference voltage, and
    the switching circuit switches and selects the plurality of voltage references, thus changing the reference voltage.

3. The battery monitoring device according to claim 2, wherein at least one of the plurality of voltage references generates, as the reference voltage, a voltage substantially the same as a predetermined overcharge voltage for determining overcharging of the single battery cell.

4. The battery monitoring device according to claim 1, wherein the reference voltage generation circuit includes a voltage reference configured to generate, during a period of time, a changing reference voltage within a predetermined reference voltage range.

5. The battery monitoring device according to claim 4, wherein the voltage reference includes an oscillator configured to change the reference voltage periodically.

6. The battery monitoring device according to claim 4, wherein the voltage reference changes the reference voltage by outputting, as the reference voltage, a voltage across a capacitor when the capacitor is charged or discharged.

7. The battery monitoring device according to claim 1, wherein the AD converter is a successive conversion-type AD converter.

8. A battery system monitoring device, comprising:
    the battery monitoring device according to claim 1; and
    a battery controller configured to receive, from the battery monitoring device, measurement information according to the digital signal which is output from the AD converter of the battery monitoring device,
    wherein the battery controller detects abnormality of the AD converter on the basis of the measurement information obtained when the reference voltage is measured by the AD converter.

* * * * *